United States Patent
Chang

(10) Patent No.: US 7,777,654 B2
(45) Date of Patent: Aug. 17, 2010

(54) SYSTEM AND METHOD FOR CONTEXT-BASED ADAPTIVE BINARY ARITHEMATIC ENCODING AND DECODING

(75) Inventor: Yuan-Teng Chang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 33 days.

(21) Appl. No.: 12/189,457

(22) Filed: Aug. 11, 2008

(65) Prior Publication Data

US 2009/0096643 A1    Apr. 16, 2009

Related U.S. Application Data

(60) Provisional application No. 60/980,256, filed on Oct. 16, 2007.

(51) Int. Cl.
*H03M 7/00* (2006.01)
(52) U.S. Cl. .................................. 341/107; 341/50
(58) Field of Classification Search ............. 341/107, 341/50, 51, 65, 67; 375/240
See application file for complete search history.

(56) References Cited

U.S. PATENT DOCUMENTS

| | | | |
|---|---|---|---|
| 6,900,748 B2* | 5/2005 | Marpe et al. ............. | 341/107 |
| 7,079,057 B2 | 7/2006 | Kim et al. | |
| 7,088,272 B2* | 8/2006 | Nomura ..................... | 341/107 |
| 7,599,435 B2* | 10/2009 | Marpe et al. ............ | 375/240.16 |
| 2005/0088324 A1 | 4/2005 | Fuchigami et al. | |
| 2005/0259747 A1 | 11/2005 | Schumann | |
| 2006/0023795 A1 | 2/2006 | Kim | |
| 2006/0033848 A1 | 2/2006 | Chia | |
| 2006/0126744 A1 | 6/2006 | Peng et al. | |
| 2006/0220927 A1 | 10/2006 | Park | |
| 2006/0294174 A1 | 12/2006 | Haque et al. | |
| 2007/0080832 A1* | 4/2007 | Yang et al. ................. | 341/50 |
| 2007/0097850 A1 | 5/2007 | Park et al. | |
| 2007/0103347 A1 | 5/2007 | Park et al. | |
| 2007/0115154 A1* | 5/2007 | Park et al. ................. | 341/51 |
| 2007/0183491 A1* | 8/2007 | Pearson et al. ........... | 375/240 |

OTHER PUBLICATIONS

Yu et al., "A High Performance CABAC Decoding Architecture," *IEEE Transactions on Consumer Electronics*, vol. 51, No. 4, Nov. 2005, pp. 1352-1359.
Osorio et al., "Arithmetic Coding Architecture for H.264/AVC CABAC Compression System," *IEEE Computer Society, Digital System Design*, Sep. 2004, pp. 62-69.

(Continued)

*Primary Examiner*—Peguy JeanPierre
(74) *Attorney, Agent, or Firm*—Alston & Bird LLP

(57) ABSTRACT

A system is disclosed for context-based adaptive binary arithmetic encoding and decoding. The system comprises a calculating device configured to calculate an index value for one of a first bin to be encoded and a second bin to be decoded, a memory device to store context models in cluster, wherein the index value for one of the first bin and the second bin is related to one of the context models, and a binary arithmetic unit configured to serve as one of an encoder for encoding the first bin based on the one context model and a decoder for decoding the second bin based on the one context model.

30 Claims, 15 Drawing Sheets

OTHER PUBLICATIONS

Marpe et al., "Context-Based Adaptive Binary Arithmetic Coding in the H.264/AVC Video Compression Standard," *IEEE Transactions on Circuits and Systems for Video Technology*, vol. 13, No. 7, Jul. 2003, pp. 620-636.

Zhang et al., "Context-Based Arithmetic Coding Reexamined for DCT Video Compression," *IEEE International Symposium on Circuits and Systems*, May 2007, pp. 3147-3150.

Li et al., "Hardware Architecture Design of CABAC Codec for H.264/Avc," *International Symposium on VLSI Design, Automation and Test*, Apr. 2007, pp. 1-4.

Nunez-Yanez et al., "Hardware Assisted Rate Distortion Optimization with Embedded CABAC Accelerator for the H.264 Advanced Video Codec," *IEEE Transactions on Consumer Electronics*, vol. 52, No. 2, May 2006, pp. 590-597.

Kim et al., "High Speed Decoding of Context-based Adaptive Binary Arithmetic Codes Using Most Probable Symbol Prediction," *IEEE International Symposium on Circuits and Systems*, May 2006, pp. 1707-1710.

Zhang et al., "High-Performance CABAC Engine for H.264/AVC High Definition Real-Time Decoding," *International Conference on Consumer Electronics*, Jan. 2007, 2 pages.

Yi et al., "High-Speed H.264/AVC CABAC Decoding," *IEEE Transactions on Circuits and Systems for Video Technology*, vol. 17, No. 4, Apr. 2007, pp. 490-494.

\* cited by examiner

| Addr. | | | | | | | | | | | | | | | |
|---|---|---|---|---|---|---|---|---|---|---|---|---|---|---|---|
| 0x00 | CMs (Cluster 1) ||||||| ///////////////////////////////// ||||||||
| 0x01 | CMs (Cluster 2) |||||||||||||| /// ||
| 0x02 | CMs (Cluster 3) |||||||||| ///////// |||||
| ... | | | | | | | | | | | | | | | |
| ... | | | | | | | ... | | | | | | | | |
| 0x06 | CMs (Cluster 7) ||||||||||||||| // |
| ... | | | | | | | ... | | | | | | | | |
| 0x0c | CMs (Cluster 13) ||||||||||||||||
| ... | | | | | | | ... | | | | | | | | |
| 0x18 | CMs (Cluster 25) ||||||||||||||||
| ... | | | | | | | ... | | | | | | | | |
FIG.6B
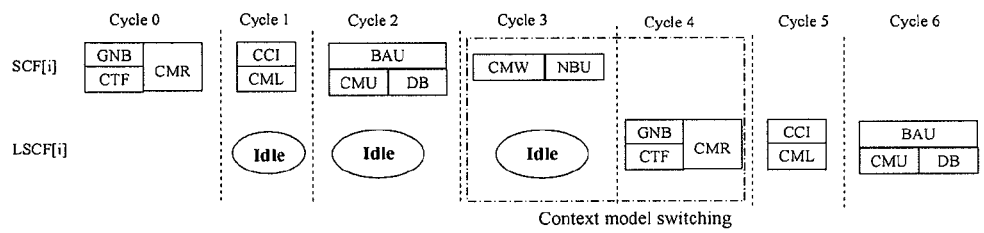
FIG.7A (PRIOR ART)
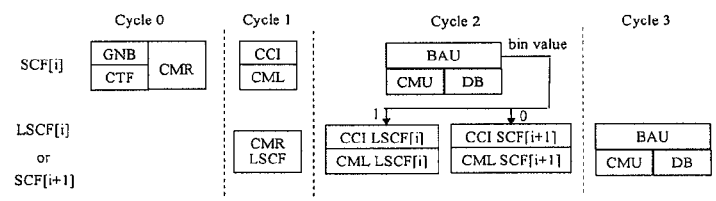
FIG.7B
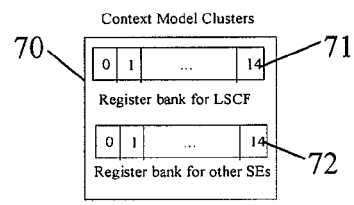
FIG.7C

SYSTEM AND METHOD FOR CONTEXT-BASED ADAPTIVE BINARY ARITHEMATIC ENCODING AND DECODING

CROSS-REFERENCE TO RELATED APPLICATIONS

This application claims the benefit of U.S. Provisional Application No. 60/980,256, filed Oct. 16, 2007, incorporated herein by reference in its entirety, and claims the benefit of its earlier filing date under 35 U.S.C. 119(e).

BACKGROUND OF THE INVENTION

The present invention generally relates to video coding and decoding and, more particularly, to a system and a method for context-based adaptive binary arithmetic coding (CABAC) and decoding.

Context-based adaptive arithmetic coding (CABAC) is an entropy coding scheme specified in the standard, H.264/AVC MAIN and HIGH profiles. FIG. 1 is a schematic diagram of a structure of an exemplary bit stream 10 such as an H.264/AVC High profile level 4.1 bit stream under the H.264 standard. Referring to FIG. 1, the bit stream 10 may include a plurality of data slices (not numbered), wherein each of the data slices may include a slice header layer 11 and a slice data layer 12. The slice data layer 12 may include a plurality of macro blocks (MBs) 13, wherein each of the MBs 13 may include one or more syntax element (SE) 14. Each of the SE 14 has a value and may further include one or more bin 15, which in turn is a binary value, i.e., either 0 or 1.

Algorithms for CABAC encoding and decoding are briefly discussed below. FIG. 2A is a flow diagram illustrating an algorithm for CABAC encoding. Referring to FIG. 2A, before encoding the first SE in a slice data layer, a number of 459 sets of context models (CMs) are initialized at step 20. Each of the CMs includes a 6-bit probability state index (pStateIdx) and a 1-bit most probability symbol (valMPS) that has a bin value. To encode an SE, four major steps including binarization, context model selection, binary arithmetic encoding and bit-generation may be required. At step 21, an SE is converted by its value into a bin string, which is composed of one or more binary bit. Next, one of the 459 sets of CMs may be selected for each bin in the bin string based on a context model index (ctxIdx) at step 22. In response to a selected CM, a binary arithmetic coder (BAC) may encode a bin at step 23. After encoding the bin, the BAC performs renormalization and updates the selected CM at step 24. Subsequently, encoded bit data may be generated at step 25.

FIG. 2B is a flow diagram illustrating an algorithm for CABAC decoding. Referring to FIG. 2B, before decoding bin(s) of an SE, the 459 sets of CMs are initialized at step 20. To decode each bin of an SE, three major steps including context model selection, binary arithmetic decoding and de-binarization may be required. At step 22, a CM for a bin is selected based on a ctxIdx, which may be a constant or a value determined by previously decoded bins or information from neighbor blocks. In response to a selected CM, a binary arithmetic decoder (BAD) may decode the bin at step 26. Furthermore, the BAD updates the selected CM at step 24 and outputs a value of the bin. The CM update and bin value output steps are repeated until a bin string is generated for the SE. Subsequently, the decoded bin string is de-binarized to generate the value of the SE.

From FIGS. 2A and 2B, it may be found that some processes such as CM initialization and CM selection may be common to the coding and decoding schemes. It may therefore be desirable to have a system that integrates the CABAC encoding and decoding schemes. Furthermore, it may also be desirable to have a system that processes CABAC encoding and decoding in a pipeline architecture.

BRIEF SUMMARY OF THE INVENTION

Examples of the present invention may provide a system for context-based adaptive binary arithmetic encoding and decoding. The system comprises a calculating device configured to calculate an index value for one of a first bin to be encoded and a second bin to be decoded, a memory device to store context models in cluster, wherein the index value for one of the first bin and the second bin is related to one of the context models, and a binary arithmetic unit configured to serve as one of an encoder for encoding the first bin based on the one context model and a decoder for decoding the second bin based on the one context model.

Some examples of the present invention may also provide a method of context-based adaptive binary arithmetic encoding and decoding in a pipeline flow. The method comprises reading context models related to a syntax element having a number of M bins, obtaining information from at least one neighbor block and calculating a variable based on the information from the at least one neighbor block for the syntax element at a first clock cycle, calculating a first index value for a first bin of the syntax element based on the variable and loading one of the context models for the first bin based on the first index value at a second clock cycle, processing the first bin in one of an encoding process and a decoding process based on the one context model related to the first bin and updating said one context model after processing the first bin at a third clock cycle, calculating a second index value for a second bin of the syntax element based on the variable and loading one of the context models for the second bin based on the second index value at the third clock cycle, and processing the second bin in the one of the encoding process and the decoding process based on the one context model related to the second bin and updating said one context model after processing the second bin at a fourth clock cycle.

Examples of the present invention may still provide a method of context-based adaptive binary arithmetic encoding and decoding in a pipeline flow. The method comprises reading context models related to a first syntax element, obtaining information from at least one neighbor block and calculating a variable based on the information from the at least one neighbor block at a first clock cycle, calculating a first index value for a first bin of the first syntax element based on the variable and loading one of the context models for the first bin of the first syntax element based on said first index value at a second clock cycle, reading context models related to a second syntax element at the second clock cycle, wherein the first syntax element and the second syntax element occur in pair in data processing, decoding the first bin of the first syntax element based on the one context model related to the first bin of the first syntax element and obtaining a value of the first bin of the first syntax element at a third clock cycle, calculating a first index value for a first bin of the second syntax element based on the variable and loading one of the context models for the first bin of the second syntax element based on said first index value at the third clock cycle in response to one level of the value of the first bin of the first syntax element, and calculating a second index value for a second bin of the first syntax element based on the variable and loading one of the context models for the second bin of the first syntax element based on said second index value at the third clock cycle in response to the other one level of the value of the first bin of the first syntax element.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings examples which are presently preferred. It should be understood, however, that the invention is not limited to the precise arrangements and instrumentalities shown.

In the drawings:

FIG. 6B is a schematic diagram illustrating an exemplary placement of CMs in a memory according to the present invention;

FIG. 7A is a schematic diagram illustrating CM switching between syntax elements SCF[i] and LSCF[i];

FIG. 7B is a schematic diagram illustrating a pipeline mechanism for processing syntax elements SCF[i] and LSCF[i] according to an example of the present invention;

FIG. 7C is a schematic diagram of a memory including a dedicated register bank for the syntax element LSCF according to an example of the present invention;

DETAILED DESCRIPTION OF THE INVENTION

Reference will now be made in detail to the present examples of the invention, examples of which are illustrated in the accompanying drawings. Wherever possible, the same reference numbers will be used throughout the drawings to refer to the same or like parts.

Figure 1:
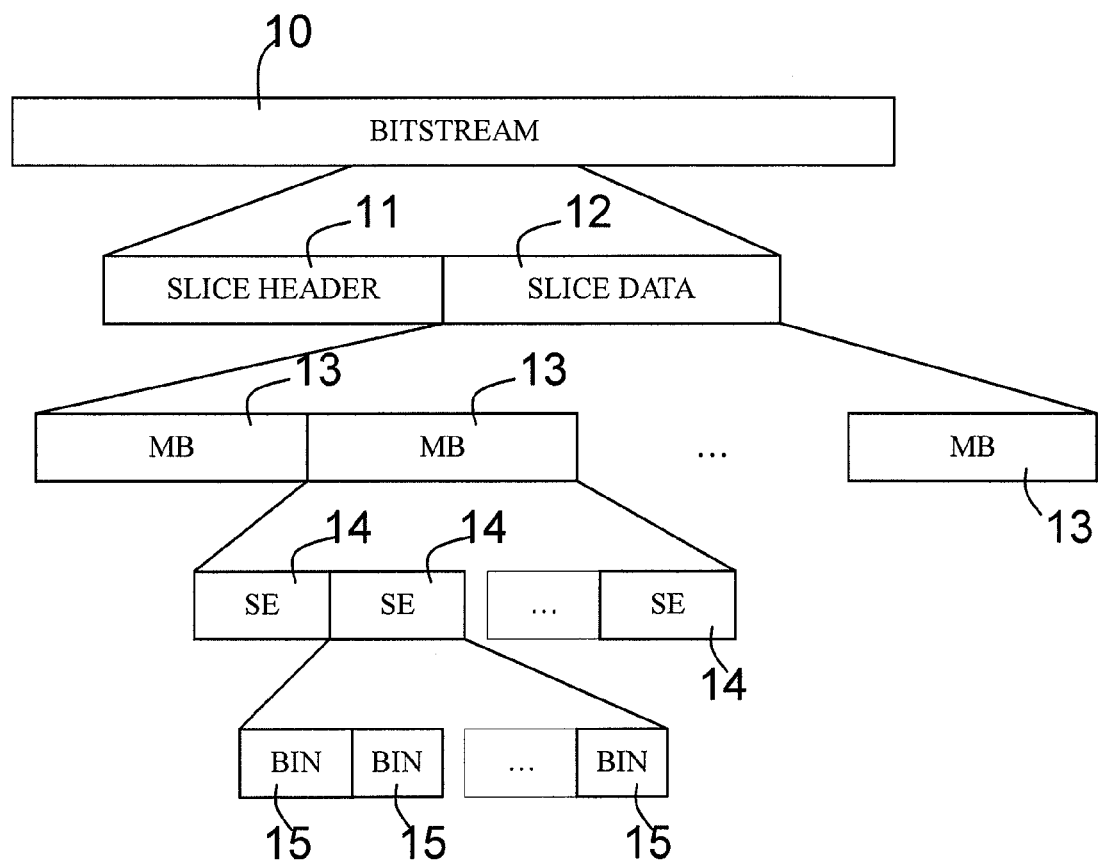
FIG. 1 is a schematic diagram of a structure of an exemplary bit stream under the H.264 standard.
Figure 2A:
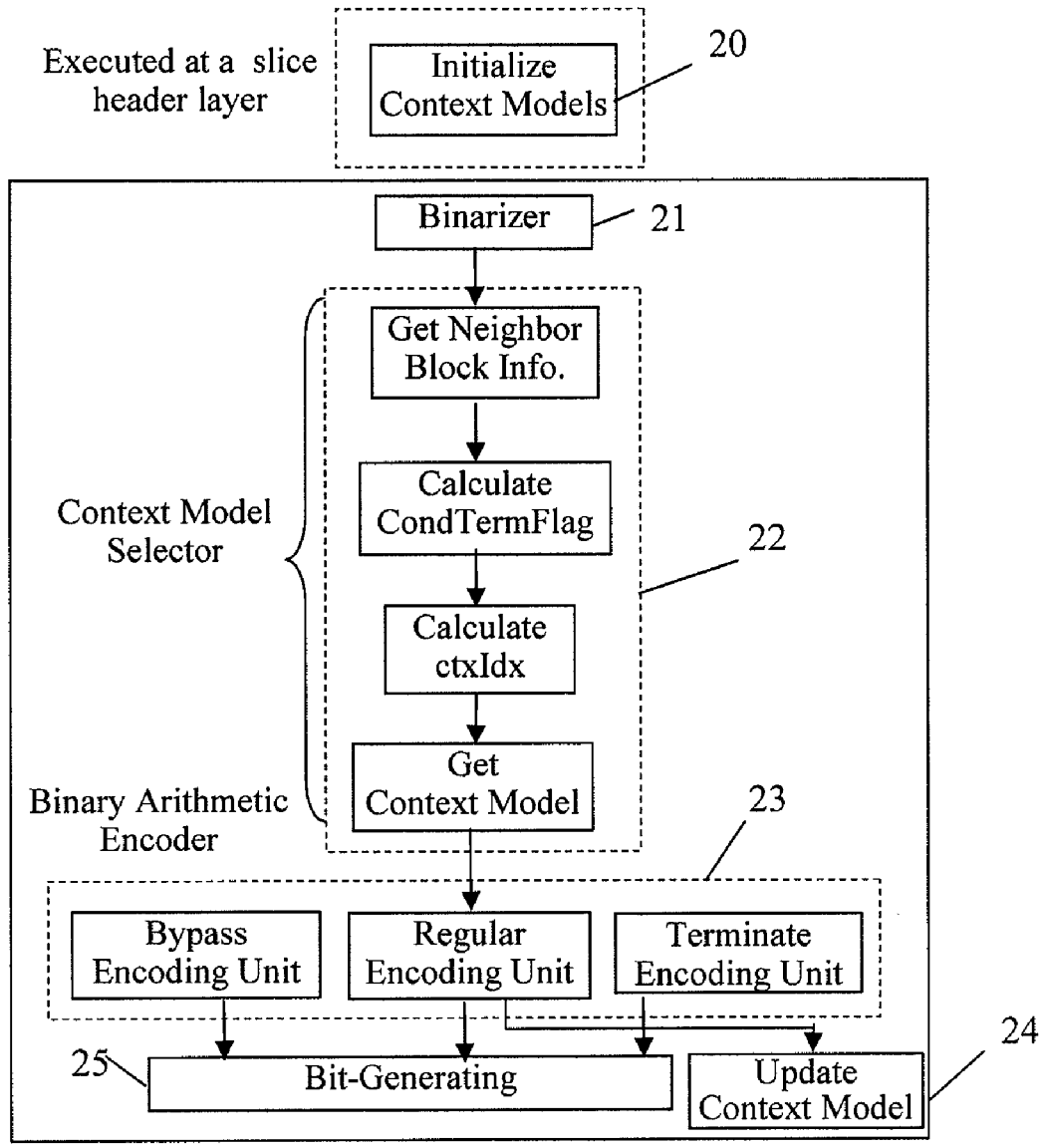
FIG. 2A is a flow diagram illustrating an algorithm for context-based adaptive binary arithmetic coding (CABAC) encoding.
Figure 2B:
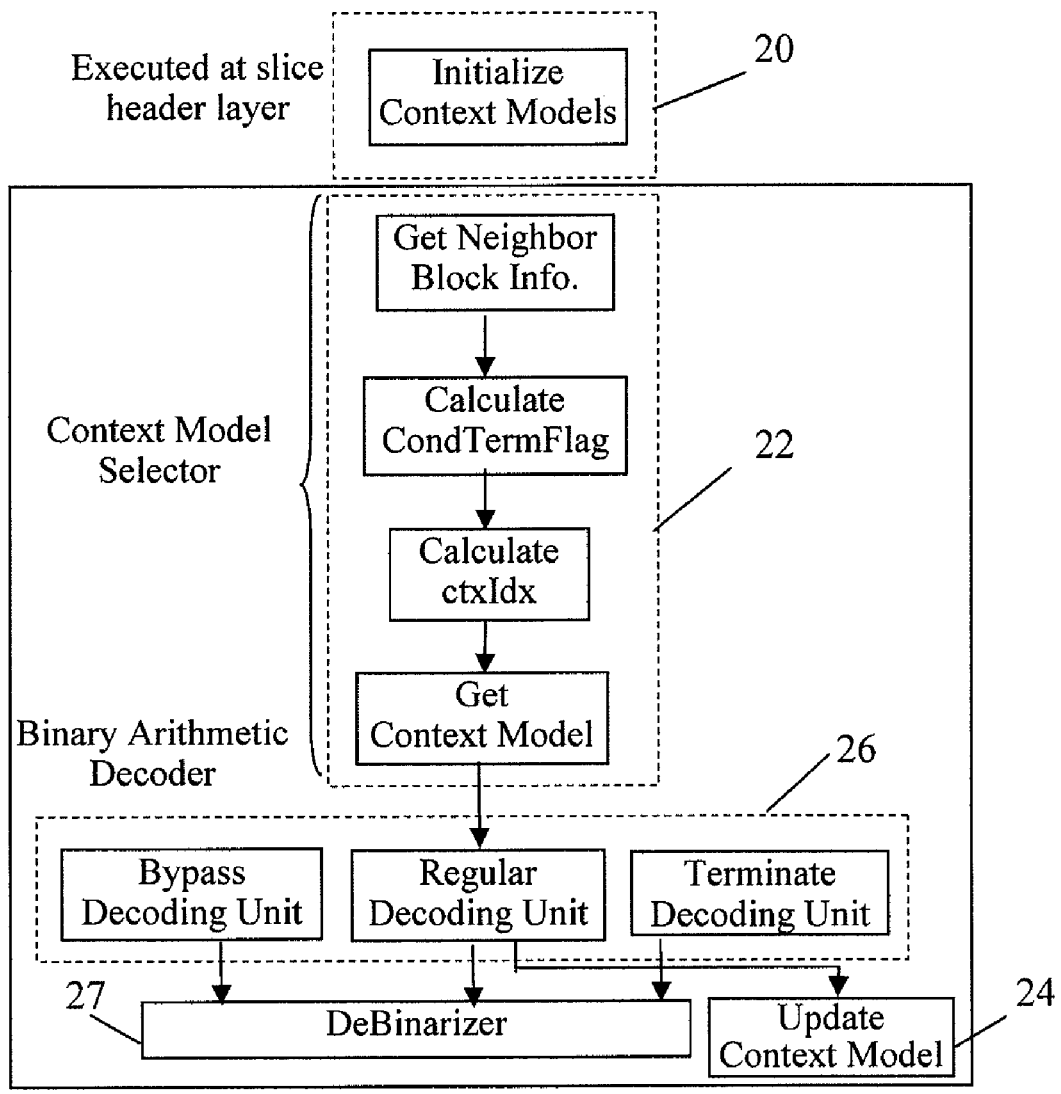
FIG. 2B is a flow diagram illustrating an algorithm for context-based adaptive binary arithmetic coding (CABAC) decoding.
Figure 3A:
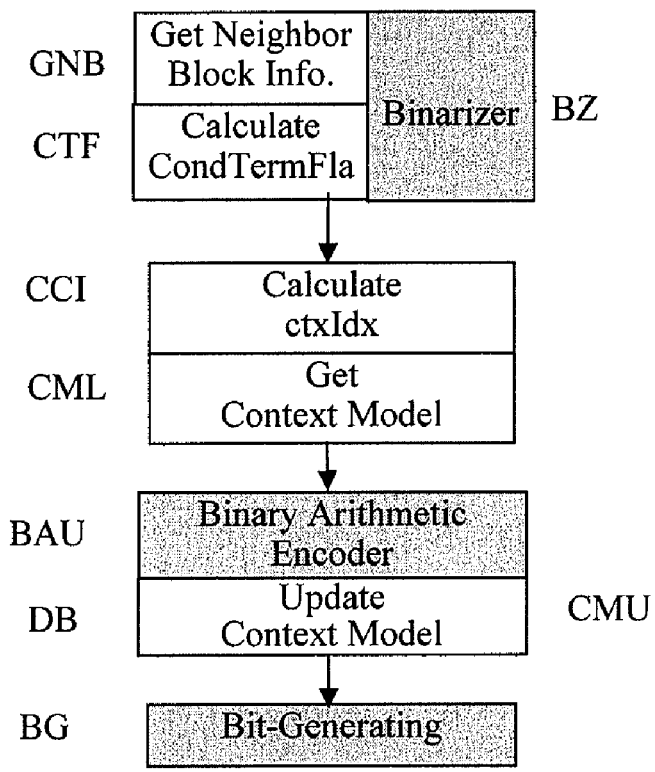
FIG. 3A is a schematic flow diagram illustrating pipeline stages for CABAC encoding in an exemplary system according to the present invention.

FIG. 3A is a schematic flow diagram illustrating pipeline stages for CABAC encoding in an exemplary system according to the present invention. Referring to FIG. 3A, the pipeline stages for CABAC encoding may include, for example, a binarization, context model (CM) selection, binary arithmetic encoding and bit generation stages. In the binarization stage, the value of a syntax element (SE) may be converted into a bin string. CABAC adopts five binarization schemes depending on the type of an SE. The five schemes further include a fixed length (FL), unary (U), truncated unary (TU), tree structure, and concatenated unary/k-th order Exp-Golomb (UEGk) schemes. The five schemes and the maximum length of a bin string are shown in Table 1 below.

TABLE 1

Types of binarization for syntax elements

| Type of Binarization | Type of Syntax Element | Max. Length of BinString |
|---|---|---|
| fixed length (FL) | mb_skip_flag, pred_mode_falg, rem_pred_mode, mb_field_decoding_flag, transform_size_8×8_flag, end_of_slice, significant_coef_flag, last_significant_coef_flag, coef_sign_flag | 7 |
| tree structure | mb_type, sub_mb_type | 13 |
| unary (U) | ref_idx, mb_qp_delta | 32 |
| truncated unary (TU) | intra_chroma_pred_mode | 3 |
| FL + TU | coded_block_pattern | 6 |
| TU + UEGk | mvd, coefficient_abs_level_minus1 | 45 |

In the CM selection stage, one of the 459 sets of context models (CMs) may be selected for each bin of the SE based on a context model index "ctxIdx" to facilitate encoding each "regular" bin of a syntax element. The ctxIdx is derived by an equation (1) below.

$$ctxIdx = ctxCatOffset + ctxIdxOffset + ctxIdxInc \quad (1)$$

Where ctxIdxOffset and ctxCatOffset may be identified by the type of an SE and the type of residual blocks, respectively, and ctxIdxInc may derived by equations (2) and (3) below.

$$condTermFlag = a*condTermFlagA + b*condTermFlagB + c \quad (2)$$

$$ctxIdxInc = \begin{cases} condTermFlag \\ constant \\ \text{dependent-on-previous-bin-values} \end{cases} \quad (3)$$

Where a, b and c in equation (2) are constants, and condTermFlagA and condTermFlagB in equation (3) are calculated based on the information from neighbor blocks. For example, condTermFlagA may be identified by information from a left block or macroblock and condTermFlagB may be identified by information from a top block or macroblock.

The CM selection stage may be further divided into four sub-stages: getting neighbor block information (GNB), calculating condTermFlag (CTF), calculating ctxIdx (CCI) and getting a CM (CML). The GNB sub-stage is performed before the CTF sub-stages, and the GNB and CTF sub-stages may be performed in parallel with the binarization stage.

In the binary arithmetic encoding stage, three encoding engines may be used, which include a "regular" engine, a "bypass" engine and a "terminate" engine. Variables codILow and codIRange may be initialized at the beginning of encoding a first macroblock in a slice. The values of codILow and codIRange may be changed during the encoding process. Each bin in a bin string will be encoded by one of the three encoding engines, in which a corresponding CM composed of a 6-bit pStateIdx and a 1-bit valMPS is required for the regular engine in encoding a bin. Furthermore, the selected CM may be updated during the regular encoding process.

A renormalization process may be required in the binary arithmetic encoding stage when the value of codIRange is less than 256. The codIRange and codILow may be doubled until their values are no smaller than 256. In the meanwhile, encoded bit data may be generated iteratively in the bit generation stage.

Figure 3B:
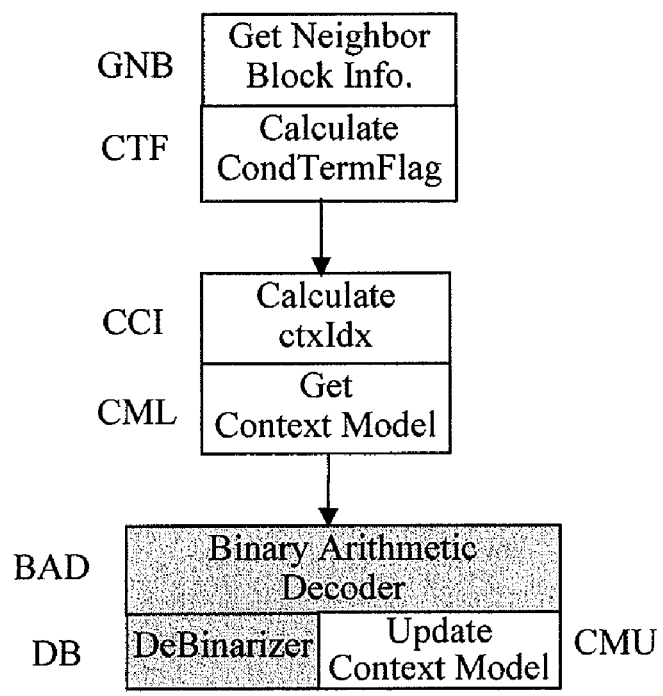
FIG. 3B is a schematic flow diagram illustrating pipeline stages for CABAC decoding in the exemplary system.

FIG. 3B is a schematic flow diagram illustrating pipeline stages for CABAC decoding in the exemplary system. Referring to FIG. 3B, the pipeline stages for CABAC decoding may include, for example, a CM selection, binary arithmetic decoding and de-binarization stages. In the CM selection stage, a CM may be selected based on a calculated ctxIdx, which, as has been previously described, may be a constant or a value determined by previously decoded bins or the information from neighbor blocks. A bin of an SE may be decoded in the binary arithmetic stage based on a selected CM. Furthermore, the selected CM may be updated and a value of the bin may be generated. The CM update and bin value output steps may be repeated until a bin string is generated for the SE. Subsequently, the decoded bin string is de-binarized to generate the value of the SE. Moreover, a renormalization process may be required for the regular decoding engine in the binary arithmetic decoding stage when the value of codIRange is less than 256. The codIRange may be doubled and codIOffset may concatenate 1-bit data from a decoded bit stream until the codIRange is no smaller than 256.

Figure 3C:
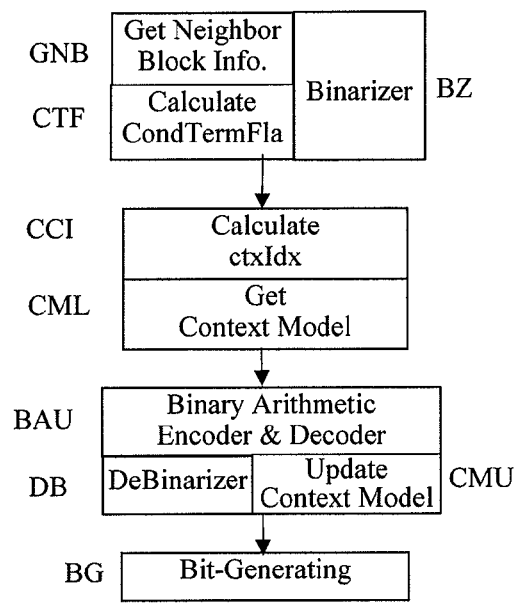
FIG. 3C is a schematic flow diagram illustrating pipeline stages for CABAC encoding and decoding in the exemplary system.

FIG. 3C is a schematic flow diagram illustrating pipeline stages for CABAC encoding/decoding in the exemplary system. Referring to FIG. 3C, the pipeline stages for CABAC encoding/decoding integrates the CABAC encoding stages illustrated in FIG. 3A with the CABAC decoding stages illustrated in FIG. 3B. During a CABAC encoding process, the binarization and bit generation stages are performed and the de-binarization stage is not performed. On the other hand, during a CABAC decoding process, the binarization and bit generation stages are not performed and the de-binarization stage is performed.

Figure 4:
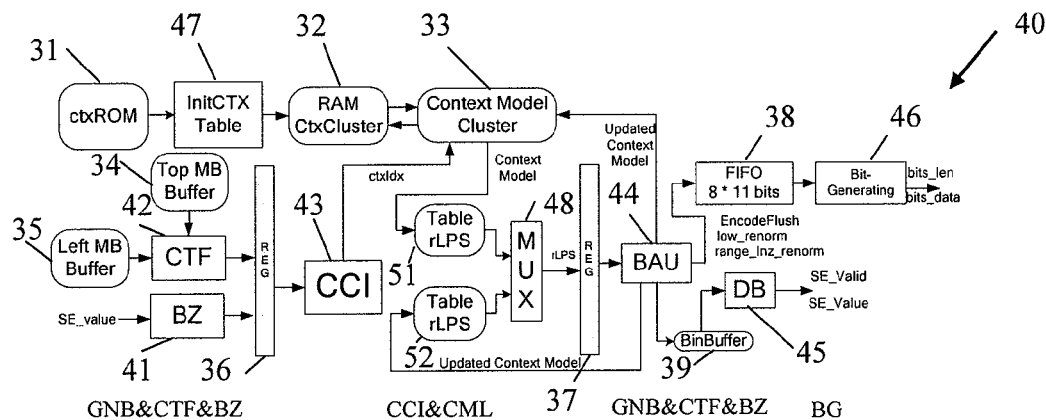
FIG. 4 is a diagram of an exemplary system for CABAC encoding and decoding according to the present invention.

FIG. 4 is a diagram of an exemplary system 40 for CABAC encoding and decoding according to the present invention. Referring to FIG. 4, the system 40 may include a binarizer (BZ) 41, calculating devices 42 and 43, a binary arithmetic unit (BAU) 44, a de-binarizer (DB) 45, a bit generator (BG) 46 and memory devices 31 to 39. Prior to an encoding or decoding process, CMs may be initialized. Variables for initializing the 459 sets of CMs may be stored in the memory 31, for example, a 1762×16-bit read only memory (ROM). An initializing module 47 may be configured to initialize the 459 sets of CMs and then put the initialized CMs in cluster in the memory 32, for example, a single-port random access memory (RAM), at a slice header layer. Under the control of a controller (not shown), one of the CM clusters may be fetched from the memory 32 and read into the memory 33 through a "context model read" (CMR) operation. The memory 33 may include but is not limited to a register bank. The CMR operation may be executed during the stage GNB/CTF/BZ, which may include a binarization stage and one part of a CM selection stage.

The binarizer 41 may be configured to binarize the value of an SE (denoted as SE_value) into a bin string in the stage GNB/CTF/BZ. During the same stage, information from one or more neighbor block may be obtained (GNB). For example, information from a top block or macroblock may be stored in a buffer 34 and information from a left block or macroblock may be stored in another buffer 35. The first calculating device 42 may be configured to calculate a condTermFlag for a bin in the bin string based on the information from the one or more neighbor block in accordance with the above-mentioned equation (2). Taking the syntax element mb_skip_flag listed in the above Table 1 for example, if the mb_skip_flag of the left macroblock is 1 or left macroblock is not available, the CondTermFlagA is set to 0. Otherwise, the CondTermFlagA is set to 1. Similarly, the condTermFlagB may be decided by the information from the top block or macroblock. Outputs from the binarizer 41 and the first calculating device 42 may be stored in a first register 36.

In the CCI/CML stage, which is the other part of the CM selection stage, a second calculating device 43 may be configured to calculate a CM index (ctxIdx) based on the above-mentioned equation (1). Based on the calculated CM index from the second calculating device 43, a CM may be fetched from the memory 33. Based on the CM from the memory 33, a first "rLPS" may be generated from a first lookup table (LUT) 51, for example, an 8×256-bit LUT. The value of the first rLPS, which may be identified from the first LUT 51 by the 6-bit pStateIdx of the CM, may be used in a subsequent encoding or decoding process in the BAU 44. The first rLPS may serve as a first input to a multiplexer 48. A second rLPS from a second LUT 52 may serve as a second input to the multiplexer 48. The second rLPS may be generated by the second LUT 52 based on an updated CM from the BAU 44. One of the first rLPS and the second rLPS may be selected by the multiplexer 48 and stored in a second register 37. In one example, the multiplexer 48 may output the first rLPS if the CM index selected for the current bin is different from that for a previous bin, and may output the second rLPS if the CM index selected for the current bin is the same as that for the previous bin. In the present example, the first LUT 51 and the second LUT 52 as illustrated are separate LUTs. In other examples, however, the first LUT 51 and the second LUT 52 may be a same LUT.

The BAU 44 may be configured to encode a regular bin, a bypass bin and a terminate bin according to the type of an SE and bin index (binIdx). Some syntax elements and their corresponding encoding engines are listed in Table 2 below.

TABLE 2

Corresponding coding engines for syntax elements

| Syntax element | Coding Engine |
| --- | --- |
| mb_type (SI slice) | regular mode |
| mb_type (I slice) | regular mode |

TABLE 2-continued

Corresponding coding engines for syntax elements

| Syntax element | Coding Engine |
| --- | --- |
| mb_type(P, SP slice) | regular mode |
| mb_type(B slice) | regular mode |
| sub_mb_type(P, SP slice) | regular mode |
| sub_mb_type(B slice) | regular mode |
| mb_skip_flag(P, SP slice) | regular mode |
| mb_skip_flag(B slice) | regular mode |
| mvd_l0[ ][ ][0], mvdl1[ ][ ][0] | regular mode + bypass mode |
| mvd_l0[ ][ ][1], mvdl1[ ][ ][1] | regular mode + bypass mode |
| ref_idx_l0, ref_idx_l1 | regular mode |
| mb_qp_delta | regular mode |
| intra_chroma_pred_mode | regular mode |
| prev_intra4x4_pred_mode_flag | regular mode |
| prev_intra8x8_pred_mode_flag | |
| rem_intra4x4_pred_mode | regular mode |
| rem_intra8x8_pred_mode | |
| mb_field_decoding_flag | regular mode |
| coded_block_pattern | regular mode |
| transform_size_8x8_flag | regular mode |
| end_of_slice | terminate mode |
| coded_block_flag | regular mode |
| significant_coef_flag | regular mode |
| last_significant_coef_flag | |
| coeff_abs_level_minus1 | regular mode + bypass mode |
| coeff_sign_flag | bypass mode |

Initialized CMs may be read from the memory 32 to the memory 33 through a "context model read" (CMR) operation. If a regular bin is processed, an updated CM may need to be written to the memory 33. The encoded bin may then be transferred to the bit generator 46, which may be configured to generate an encoded bit stream. The bit generator 46 may fetch parameters such as "EncodeFlush", "low_renorm" and "range_lnz_renorm" from a first-in-first-out (FIFO) device 38, for example, an 8*11-bit register, and generate the data of the encoded bit stream, including bit length (bits_len) and bit data (bits_data). The CM selection and binary arithmetic encoding stages may be repeated until all bins of an SE are encoded completely.

The BAU 44 may also be configured to decode a regular bin, a bypass bin and a terminate bin according to the type of an SE and bin index. Initialized CMs may be read from the memory 32 to the memory 33 through the CMR operation. A decoded bin may be transferred to a buffer 39. If a bin is decode, the selected CM may be updated and written back to the memory 33. The de-binarizer 45 may determine whether all bins of the SE are decoded and output an SE value (SE_value) based on the decoded bins in the buffer 39 when the decoding of the SE is complete. The SE_Value signal may be sent to a H.264 parser unit (not shown) or a residual unit (not shown) responsible for processing the parsing flow of a residual block. In one example, the SE_Value signal may be written to the first buffer 34 and the second buffer 35 through a "neighbor buffer update" (NBU) operation. The CM selection and binary arithmetic decoding/debinarization stages may be repeated until the de-binarizer 45 detects the completion of decoding the SE and sets a completion signal SE_Valid at, for example, logic high. If all bins of the SE are decoded, the updated CMs in the memory 33 may be written back to the memory 32 through a CMW operation.

Figure 5A:
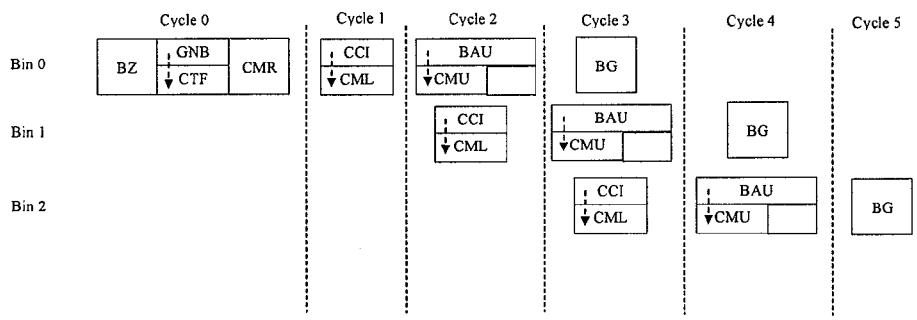
FIG. 5A is a schematic diagram illustrating a pipeline mechanism for CABAC encoding according to an example of the present invention.

FIG. 5A is a schematic diagram illustrating a pipeline mechanism for CABAC encoding according to an example of the present invention. Referring to FIG. 5A and also FIGS. 3A, 3C and 4, at cycle 0, the value of an SE may be binarized (BZ) into a bin stream comprising Bin 0, Bin 1 and Bin 2. Information from neighbor blocks may be obtained (GNB) and condtermFlag may be calculated (CTF). Furthermore, initialized CMs may be read (CMR). A dotted arrowhead from GNB to CTF may represent that GNB is performed before CTF.

At cycle 1, CM index "ctxIdx" may be calculated (CCI) and a CM for Bin 0 may be selected and loaded (CML).

At cycle 2, Bin 0 may be encoded (BAU) and then the selected CM for Bin 0 may be updated (CMU). Furthermore, CM index "ctxIdx" may be calculated (CCI) and a CM for Bin 1 may be selected and loaded (CML).

At cycle 3, a bit stream for Bin 0 may be generated (BG). Bin 1 may be encoded (BAU) and then the selected CM for Bin 1 may be updated (CMU). Furthermore, CM index "ctxIdx" may be calculated (CCI) and a CM for Bin 2 may be selected and loaded (CML).

At cycle 4, a bin stream for Bin 1 may be generated (BG). Bin 2 may be encoded (BAU) and then the selected CM for Bin 2 may be updated (CMU).

At cycle 5, a bin stream for Bin 2 may be generated (BG).

In the pipeline mechanism, data forwarding technique may be employed to handle data dependency between the operations CML and CMU. The updated CM of bin i from the stage BAU may be selected by the multiplexer 48 if the ctxIdx of bin (i+1) is the same as the ctxIdx of bin i. Another data dependency may occur in the CCI and BAU stages, in which the operation CCI of bin (i+1) may require the value of bin i. The pipeline operations for the data dependencies may cost five cycles for a macroblock at most. Specifically, Bin 1 is idle for two cycles during cycles 0 and 1, and Bin 2 is idle for three cycles during cycles 0 to 2.

Figure 5B:
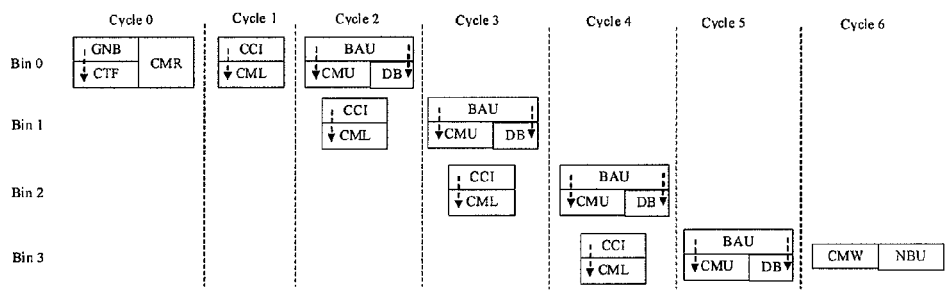
FIG. 5B is a schematic diagram illustrating a pipeline mechanism for CABAC decoding according to an example of the present invention.

FIG. 5B is a schematic diagram illustrating a pipeline mechanism for CABAC decoding according to an example of the present invention. Referring to FIG. 5B and also FIGS. 3B, 3C and 4, at cycle 0, information from neighbor blocks may be obtained (GNB) and condtermFlag may be calculated (CTF). Furthermore, initialized CMs may be read (CMR).

At cycle 1, CM index "ctxIdx" may be calculated (CCI) and a CM for Bin 0 may be selected and loaded (CML).

At cycle 2, Bin 0 may be decoded (BAU) and then the selected CM for Bin 0 may be updated (CMU). The updated CM may be sent to the memory 33. A decoded bin value for Bin 0 may be stored in the buffer 39. The de-binarizer (DB) 45 may detect that the decoding process for the SE is not complete and sets the signal SE_Valid at, for example, logic low. Furthermore, CM index "ctxIdx" may be calculated (CCI) and a CM for Bin 1 may be selected and loaded (CML).

At cycle 3, Bin 1 may be decoded (BAU) and then the selected CM for Bin 1 may be updated (CMU). The updated CM may be sent to the memory 33. A decoded bin value for Bin 1 may be stored in the buffer 39. The de-binarizer (DB) 45 may detect that the decoding process for the SE is not complete and maintains the signal SE_Valid at logic low. Furthermore, CM index "ctxIdx" may be calculated (CCI) and a CM for Bin 2 may be selected and loaded (CML).

At cycle 4, similar to cycle 3, Bin 2 may be decoded (BAU) and then the selected CM for Bin 2 may be updated (CMU). The updated CM may be sent to the memory 33. A decoded bin value for Bin 2 may be stored in the buffer 39. The de-binarizer (DB) 45 may detect that the decoding process for the SE is not complete and maintains the signal SE_Valid at logic low. Furthermore, CM index "ctxIdx" may be calculated (CCI) and a CM for Bin 3 may be selected and loaded (CML).

At cycle 5, Bin 3 may be decoded (BAU) and then the selected CM for Bin 3 may be updated (CMU). The updated CM may be sent to the memory 33. A decoded bin value for Bin 3 may be stored in the buffer 39. The de-binarizer (DB) 45 may detect that the decoding process for the SE is complete and sets the signal SE_Valid at logic high.

Subsequently, at cycle 6, the updated CMs stored in the memory 33 may be written back to the memory 32 through the CMW operation. Furthermore, the de-binarizer 45 may generate the value of the SE, i.e., SE_Value, and writes the signal SE_Value to the first buffer 34 and the second buffer 35 through the NBU operation.

Figure 6A:
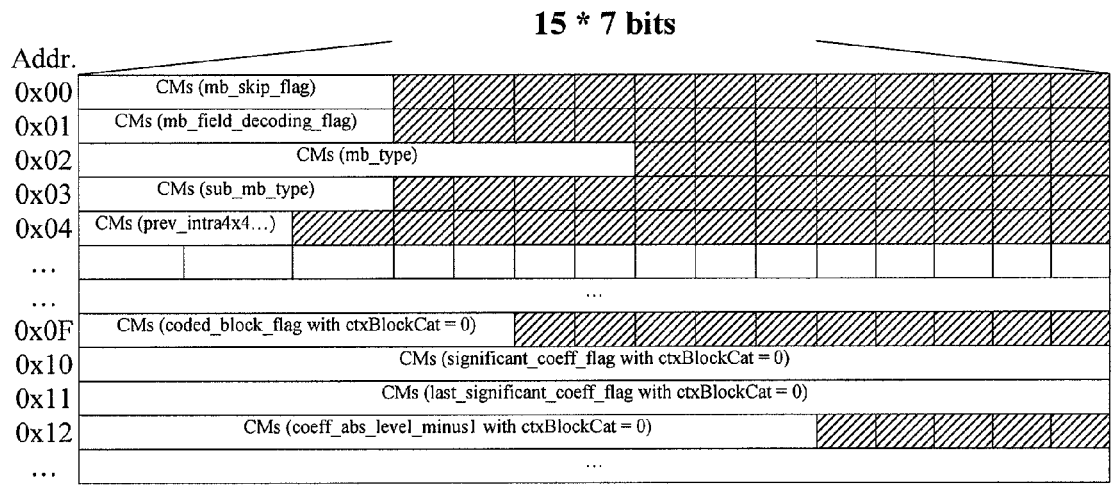
FIG. 6A is a schematic diagram illustrating an exemplary placement of context models (CMs) in a memory in prior art.

Referring again to FIGS. 5A and 5B, the operation CMR may be executed in one clock. To ensure that CMR can be completed in one clock cycle, the context models used by a same SE may be placed at a same address of the memory 33. FIG. 6A is a schematic diagram illustrating an exemplary placement of CMs in a memory in prior art. A minimum data bus width of the memory may be 105 bits (15*7 bits) because each CM has a length of seven (7) bits and the SE "significant_coeff_flag" may make use of a number of fifteen (15) sets of CMs, which is the longest SE among all of the syntax elements. However, such a placement may result in an uneconomic use of memory space.

FIG. 6B is a schematic diagram illustrating an exemplary placement of CMs in a memory according to the present invention. In one example, the 459 sets of CMs may be divided into 38 clusters as listed below.

(1) mb_skip_flag and mb_field_decoding_flag for I and P slice;
(2) mb_skip_flag and mb_field_decoding_flag for B slice;
(3) mb_type and sub_mb_type for I and P slice;
(4) mb_type and sub_mb_type for B slice;
(5) prev_intra4×4_pred_mode_flag, prev_intra8×8_pred_mode_flag, rem_intra4×4_pred_mode, rem_intra8×8_pred_mode, intra_chroma_pred_mode and mb_qp_delta;
(6) mvd__l0 and mvd__l1;
(7) ref_idx__l0, ref_idx__l1 and transform_size__8×8_flag;
(8) coded_block_pattern;
(9) coded_block_flag and coeff_abs_level_minus1 for luma DC block;
(10) coded_block_flag and coeff_abs_level_minus1 for luma AC block;
(11) coded_block_flag and coeff_abs_level_minus1 for 4×4 luma block;
(12) coded_block_flag and coeff_abs_level_minus1 for chroma DC block;
(13) coded_block_flag and coeff_abs_level_minus1 for chroma AC block;
(14) coded_block_flag and coeff_abs_level_minus1 for 8×8 luma block;
(15) significant_coeff_flag for frame-coded luma DC block;
(16) last_significant_coeff_flag for frame-coded luma DC block;
(17) significant_coeff_flag for field-coded luma DC block;
(18) last_significant_coeff_flag for field-coded luma DC block;
(19) significant_coeff_flag for frame-coded luma AC block;
(20) last_significant_coeff_flag for frame-coded luma AC block;
(21) significant_coeff_flag for field-coded luma AC block;
(22) last_significant_coeff_flag for field-coded luma AC block;
(23) significant_coeff_flag for frame-coded 4×4 luma block
(24) last_significant_coeff_flag for frame-coded 4×4 luma block;
(25) significant_coeff_flag for field-coded 4×4 luma block;
(26) last_significant_coeff_flag for field-coded 4×4 luma block;
(27) significant_coeff_flag for frame-coded chroma DC block;
(28) last_significant_coeff_flag for frame-coded chroma DC block;
(29) significant_coeff_flag for field-coded chroma DC block;
(30) last_significant_coeff_flag for field-coded chroma DC block;
(31) significant_coeff_flag for frame-coded chroma AC block;
(32) last_significant_coeff_flag for frame-coded chroma AC block;
(33) significant_coeff_flag for field-coded chroma AC block;
(34) last_significant_coeff_flag for field-coded chroma AC block;
(35) significant_coeff_flag for frame-coded 8×8 luma block;
(36) last_significant_coeff_flag for frame-coded 8×8 luma block;
(37) significant_coeff_flag for field-coded 8×8 luma block; and
(38) last_significant_coeff_flag for field-coded 8×8 luma block.

The 38 clusters may be placed in a memory in accordance with the rules given as follows.

Rule 1: #CMs $(SE_i)$+#CMs $(SE_{i+1})$+ . . . +#CMs $(SE_{i+n})$≦ 15

Where $SE_i$ represents an i-th syntax element, and #CMs $(SE_i)$ represents the number of context models used in encoding or decoding the $SE_i$.

Rule 2: $SE_i$, $SE_{i+1}$, . . . , $SE_{i+n}$ are in an encoding or decoding order.

By applying Rule 1 and Rule 2, CMs used for an SE may be arranged in cluster at a same address of the memory if the number of the CMs is equal to or smaller than 15. Referring to FIG. 6B, each cluster occupies one entry of memory space and may be loaded to a register bank composed of, for example, fifteen 7-bit registers, in one clock cycle. Such a placement may reduce the use of memory space from, for example, 662 bytes to 460 bytes. In addition, such a placement may lower the memory access frequency. For example, the CMs for the SE "mb_field_decoding_flag" may not need to be loaded in a separate entry after processing the SE "mb_skip_flag" because both of the SEs belong to the same cluster (2) and may be already loaded while decoding the SE mb_skip_flag. As compared to the placement illustrated in FIG. 6A, the placement according to the present invention illustrated in FIG. 6B achieves a more economical use of memory space.

FIG. 7A is a schematic diagram illustrating CM switching between syntax elements SCF[i] and LSCF[i]. Referring to FIG. 7A, as specified in the H.264 standard, a 1-bin SE "last_significant_coeff_flag[i]" (LSCF[i]) may not be processed until a 1-bin SE "significant_coeff_flag[i]" (SCF[i]) is processed, wherein the processing for SCF[i] and LSCF[i] may include encoding or decoding. In the present example, a CM switching may occur between cycle 3 when the decoding process for SCF[i] is completed and cycle 4 when the decoding process for LSCF[i] starts. The 1-bin SCF[i] may determine whether a coefficient at a position i is nonzero and the 1-bin LSCF[i] may indicate whether subsequent SCFs following the position i are all zeros. If the value of SCF[i] is 1, LSCF[i] exists. In such a case, if the value of LSCF[i] is also 1, the following SCFs are all zeros and need not be processed.

On the other hand, if the value of SCF[i] is 0, LSCF[i] needs not be processed, and SCF[i+1] may be coded as shown in Table 3 below.

TABLE 3

An example for SCF and LSCF pair of a Luma 4 × 4 DC block

| | index | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| SCF | 1 | 0 | 0 | 1 | 0 | 0 | 0 | 1 | 1 | 0 | 0 | 0 | 0 | 0 | 0 | 0 |
| LSCF | 0 | x | x | 0 | x | x | x | 0 | 1 | x | x | x | x | x | x | x |

The CM switching may cost three idle cycles in the pipelined operation based on the H.264 standard as compared to a pipeline mechanism illustrated in FIG. 7B. FIG. 7B is a schematic diagram illustrating a pipeline mechanism for processing the SEs SCF[i] and LSCF[i] according to an example of the present invention. Moreover, FIG. 7C is a schematic diagram of a memory 70 including a dedicated register bank 71 for the syntax element LSCF according to an example of the present invention. Referring to FIG. 7B, at cycle 0, information from neighbor blocks may be obtained (GNB) and condtermFlag may be calculated (CTF). Furthermore, initialized CMs or CM cluster for SCF may be loaded (CMR) to a register bank 72 of the memory 70 illustrated in FIG. 7C.

At cycle 1, CM index "ctxIdx" may be calculated (CCI) and a CM for SCF[i] may be selected and loaded (CML). Furthermore, initialized CMs or CM cluster for LSCF may be loaded (CMR) to the register bank 71 of the memory 70.

At cycle 2, the bin SCF[i] may be decoded (BAU) and then the selected CM for the bin SCF[i] may be updated (CMU). If the decoded bin value of the bin SCF[i] is 1, which means that LSCF[i] exists, CM index "ctxIdx" may be calculated (CCI) and a CM for the bin LSCF[i] may be selected and loaded (CML). If the decoded bin value of the bin SCF[i] is 0, which means that LSCF[i] needs not be processed, CM index "ctxIdx" may be calculated (CCI) and a CM for the bin SCF[i+1] may be selected and loaded (CML).

At cycle 3, the bin LSCF[i] or SCF[i+1] may be decoded (BAU) and then the selected CM for the bin LSCF[i] or SCF[i+1] may be updated (CMU). Table 4 below shows the number of context model switching per slice at different bit rates of 8M, 22M, 47M and 51M bps given a 1920×1080 resolution video sequence. The pipeline mechanism according to the present invention may save approximately 3×382284 clock cycles per slice at the bit rate of 51M bps.

TABLE 4

Number of context model switching for different bit-rate streams

| | resolution 1920 × 1080p | | | |
|---|---|---|---|---|
| bit rate (bps) | 8M | 22M | 47M | 51M |
| Slice Types | I/P/B | I/P/B | I/P/B | I |
| QP | 25 | 20 | 17 | 18 |
| # context switches for SCF & LSCF per slice | 48960 | 138720 | 345794 | 382284 |

Figure 8:
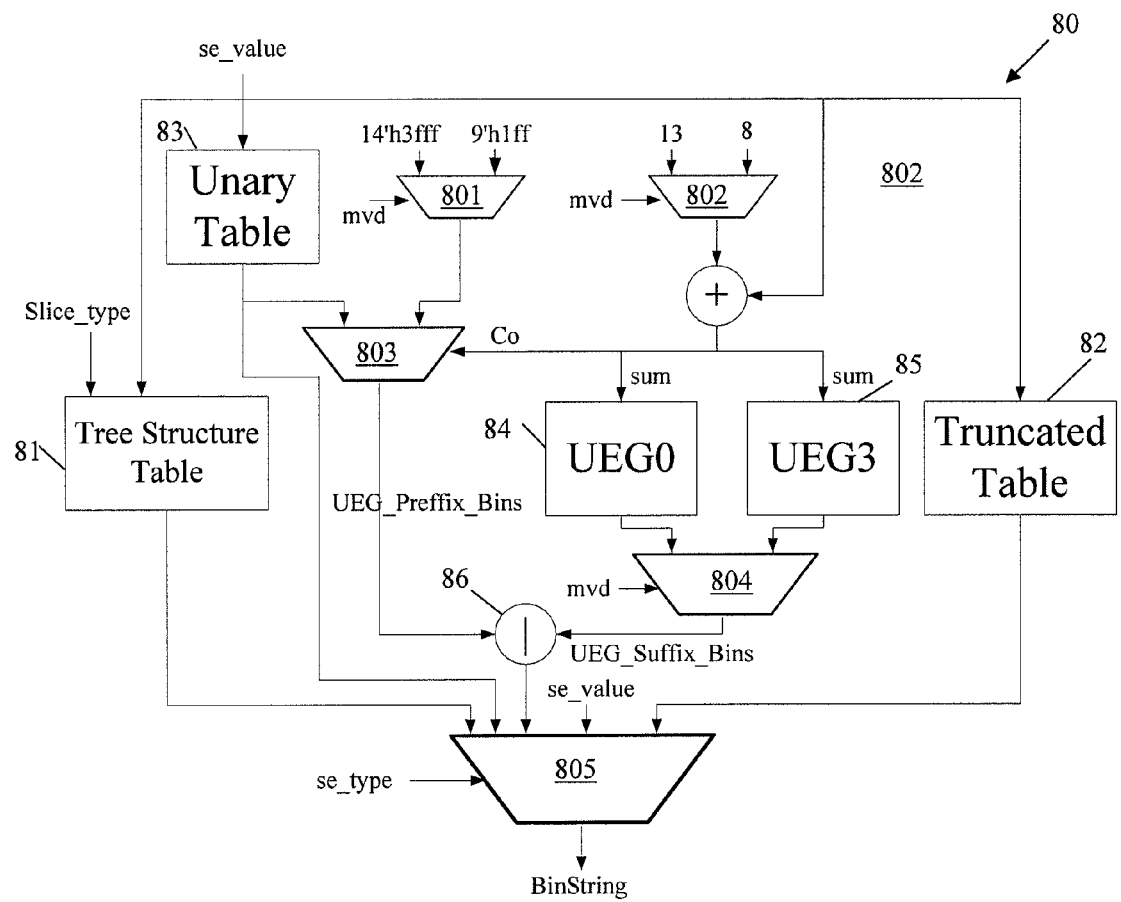
FIG. 8 is a circuit diagram of a binarizer according to an example of the present invention.

FIG. 8 is a circuit diagram of a binarizer 80 according to an example of the present invention. The binarizer 80 may be configured to generate a bin string with a length according to the value and type of an SE. Referring to FIG. 8, the binarizer 80 may include five ROM tables 81 to 85. The tree structure table 81 may be used by the SEs "mb_type and sub_mb_type" to generate a bin string therefor. The truncated table 82 may be used by the SE "intra_chroma_pred_mode." The unary table 83 may be used by the SEs "ref_idx" and "mb_qp_delta." The values of the SEs "mvd" and "coefficient_abs_level_minus1" may each be composed of a prefix part and a suffix part. The prefix parts of these two SEs may include truncated unary codes. The suffix part of mvd is a UEG3 code and the suffix part of coefficient_abs_level_minus1 is a UEG0 code. Therefore, a UEG0 table 84 and a UEG3 table 85 in conjunction with multiplexers 801 and 802 may be employed to binarize the suffix parts of these two SEs, respectively. The unary table 83 and a multiplexer 803 may be employed to binarize the prefix parts. The prefix part and the suffix part of the bin string respectively from multiplexers 803 and 804 are concatenated together at a concatenating device 86. Subsequently, using the SE type as a selector signal, a bin string may be generated from a multiplexer 805. An exemplary circuit operation of the binarizer 80 will be later discussed with reference to FIG. 12A.

Figure 9:
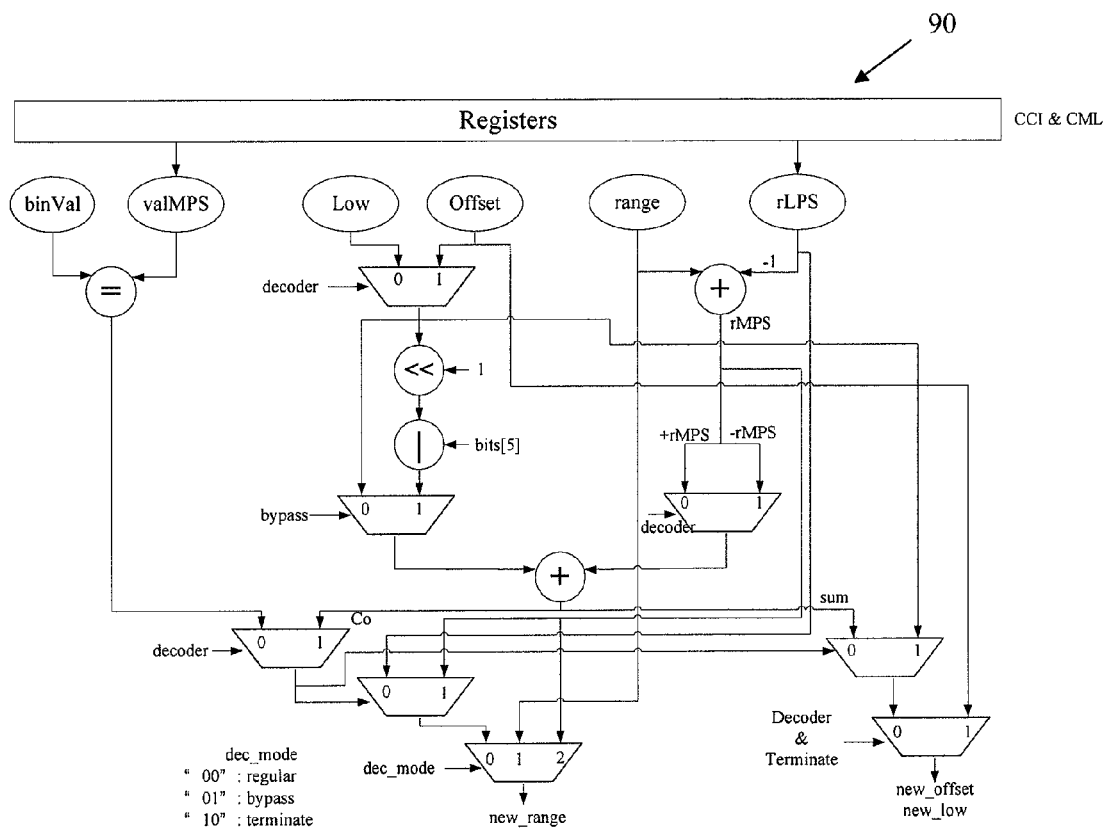
FIG. 9 is a circuit diagram of a binary arithmetic unit (BAU) according to an example of the present invention.

FIG. 9 is a circuit diagram of a binary arithmetic unit (BAU) 90 according to an example of the present invention. The BAU 90 may include a regular engine, a bypass engine and a terminate engine for CABAC encoding and decoding. Variables codIRange (denoted as range) and codILow (denoted as Low) may be updated during the process of binary arithmetic encoding. On the other hand, the variable codIRange and another variable codIOffset (denoted as Offset) may be updated during the process of binary arithmetic decoding. Algorithms for updating the variables codIRange, codILow and codIOffset, specified in the H.264 standard, are respectively shown in Table 5, Table 6 and Table 7 below for ready reference.

TABLE 5 updating the variable codIRange for BAU encoder and decoder codIRange

| | | | |
|---|---|---|---|
| Decoder | Regular | Offset >= rMPS | rLPS |
| | | Offset < rMPS | rMPS (= codIRange − rLPS) |
| | Bypass | Offset_New >= rMPS | codIRange |
| | | Offset_New < rMPS | codIRange |
| | Termination | Offset >= rMPS | codIRange − 2 |
| | | Offset < rMPS | codIRange − 2 |
| Encoder | Regular | binVal != valMPS | rLPS |
| | | binVal = valMPS | rMPS (= codIRange − rLPS) |
| | Bypass | binVal != 0 | codIRange |
| | | binVal = 0 | codIRange |
| | Termination | binVal != 0 | codIRange |
| | | binVal = 0 | codIRange − 2 |

TABLE 6 updating the variable codIOffset for BAU decoder codIOffset

| Decoder | Regular | codIOffset >= rMPS | codIOffset − rMPS |
|---------|---------|--------------------|--------------------|
|         |         | codIOffset < rMPS  | codIOffset |
|         | Bypass  | Offset_New >= rMPS | Offset_New (= codIOffset << 1 \| read_bits(1)) − rMPS |
|         |         | Offset_New < rMPS  | Offset_New |
|         | Termination | codIOffset >= rMPS | codIOffset |
|         |         | codIOffset < rMPS  | codIOffset |

TABLE 7 updating the variable codILow for BAU encoder codILow

| Encoder | Regular | binVal != valMPS | codILow + rMPS |
|---------|---------|------------------|----------------|
|         |         | binVal = valMPS  | codILow |
|         | Bypass  | binVal != 0      | (codILow << 1) + codIRange |
|         |         | binVal = 0       | codILow |
|         | Termination | binVal != 0  | codILow + rMPS |
|         |         | binVal = 0       | codILow |

Tables 5 to 7 show which values of the three variables may be re-assigned under different engines and conditions. Referring to FIG. 9, in addition to the variables Low, Offset and range, variables "bin Val", "valMPS" and "rLPS" may be inputted to the BAU 90. The value of the variable binVal may be generated from the multiplexer 805 of the binarizer 80 illustrated in FIG. 8, and the values of valMPS and rLPS may be identified when a corresponding CM is identified. The BAU 90 may update the values of range, Offset and Low and output the updated values new_range and new_offset new_low. An exemplary circuit operation of the BAU 90 will be later discussed with reference to FIG. 12B.

Figure 10:
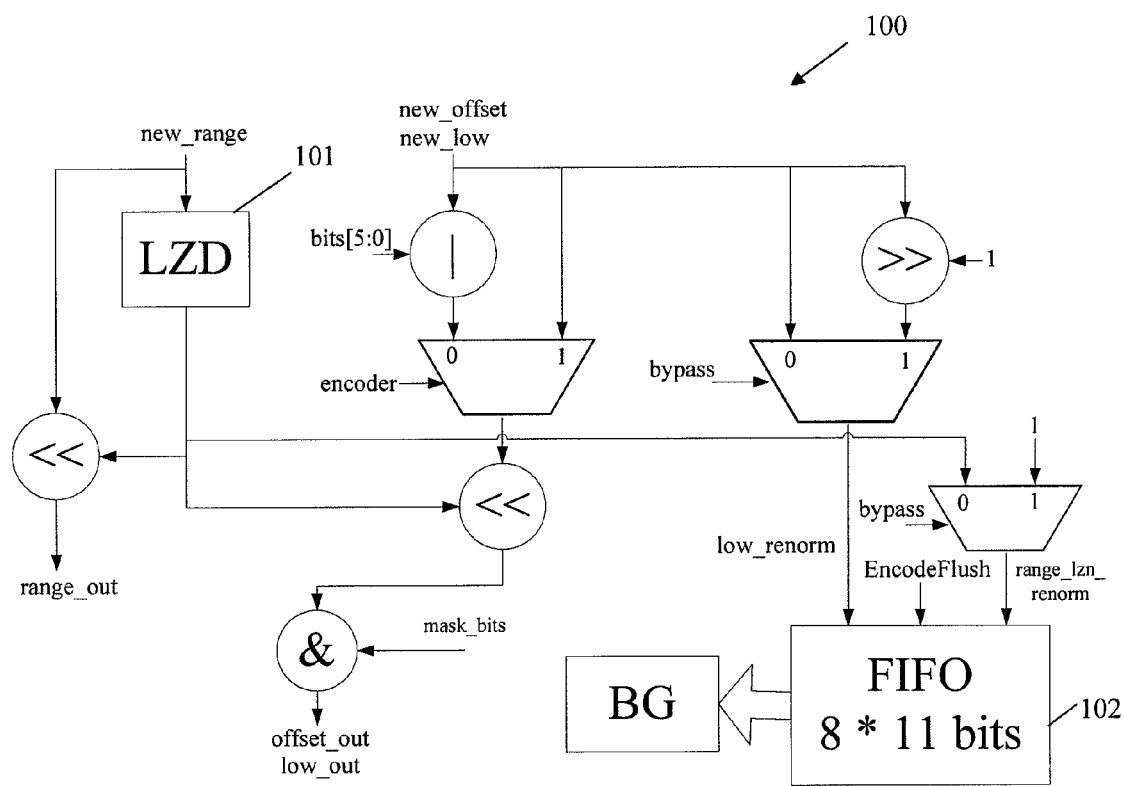
FIG. 10 is a circuit diagram of a renormalization device according to an example of the present invention.

The BAU 90 may include a renormalization device to perform a renormalization process when the codIRange for the BAU encoder and decoder is less than 256. FIG. 10 is a circuit diagram of a renormalization device 100 according to an example of the present invention. Referring to FIG. 10, the renormalization device 100 may receive the values new_range and new_offset new_low from the BAU 90. A leading zero detection (LZD) device 101 may be used to decide the number of bits to be left shifted for the codIRange, codILow and codIOffset. When the CABAC is in encoding mode and the codIRange is less than 256, the three parameters range_lzn_renorm, low_renorm and EncodeFlush may be put into a FIFO 102. An exemplary circuit operation of the renormalization device 100 will be later discussed with reference to FIG. 12C.

Figure 11:
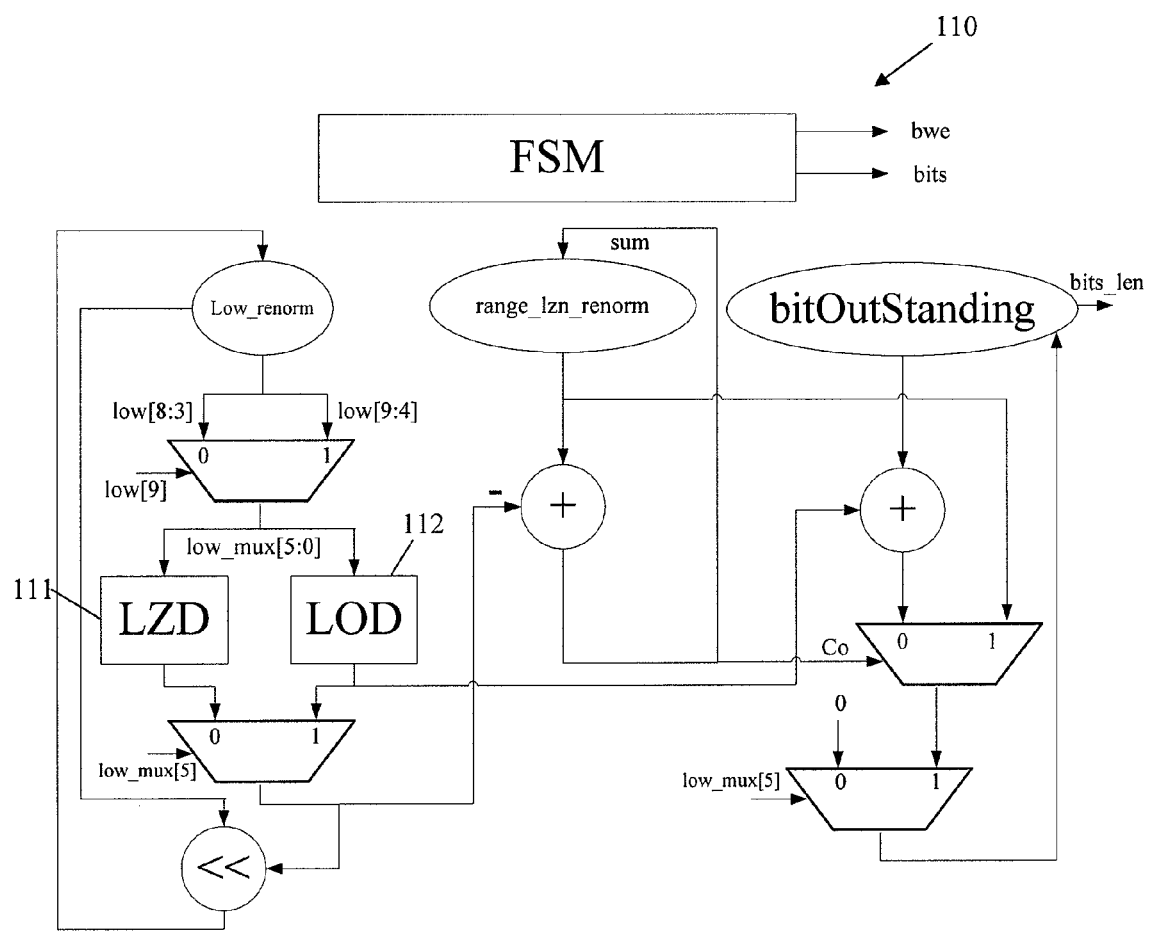
FIG. 11 is a circuit diagram of a bit generator according to an example of the present invention.

FIG. 11 is a circuit diagram of a bit generator 110 according to an example of the present invention. Referring to FIG. 11, the bit generator 110 may include a finite state machine (FSM) configured to control an execution flow. An LZD device 111 may be employed to detect the number of leading zero for a variable low_mux, which is selected from the variable low-renorm from the FIFO 102 illustrated in FIG. 10. A leading one detection (LOD) device 112 may be employed to detect the number of leading one for the variable low_mux. The bit generator 110 may generate three output signals "bit-write-enable" (bwe), "bits_len" and "bits," in which the signal bits represents a coded bit stream, "bits_len" represents the length of the coded bit stream and bwe represents the signal bits is valid. An exemplary circuit operation of the bit generator 110 will be later discussed with reference to FIG. 12D.

Figure 12A:
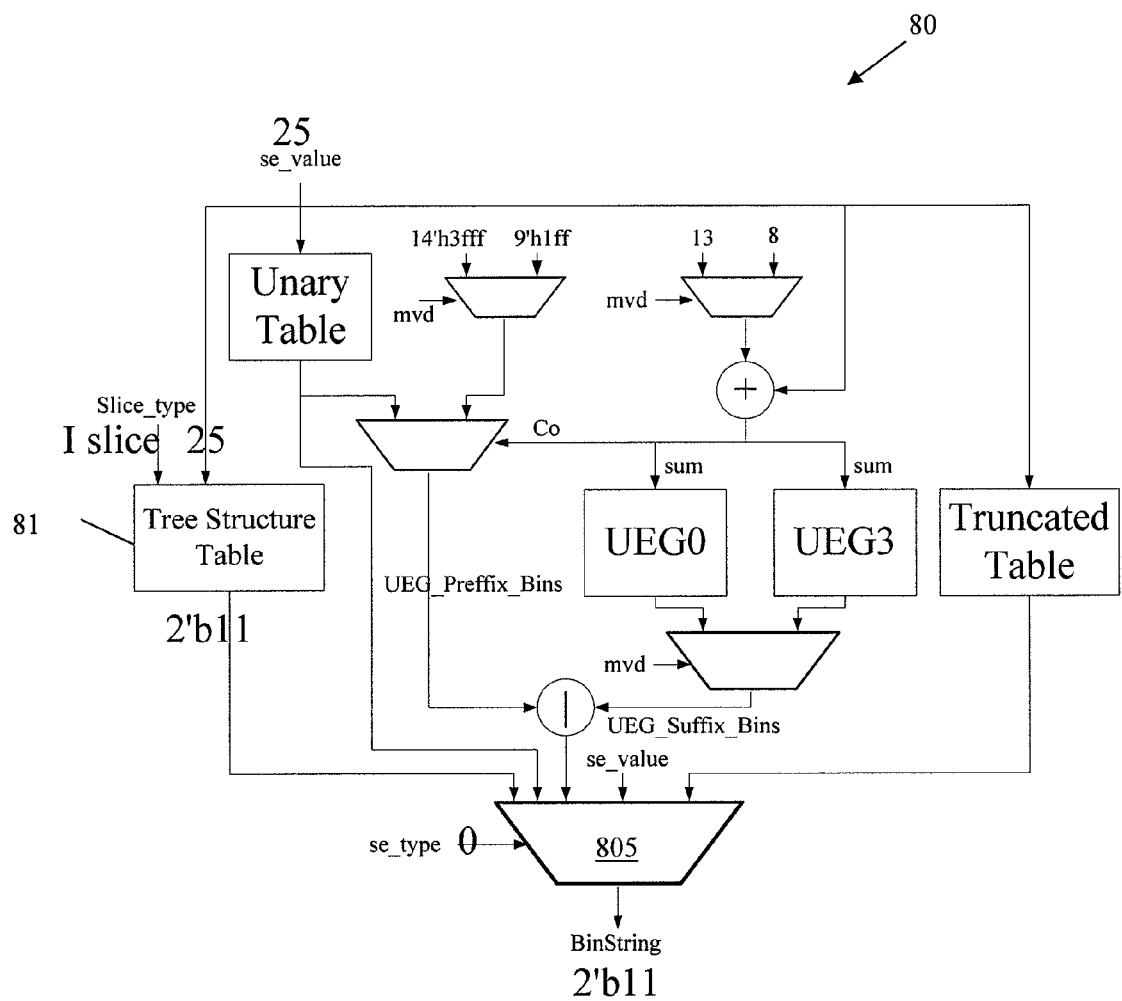
FIG. 12A is an exemplary circuit operation of the binarizer illustrated in FIG. 8.

Exemplary circuit operation of encoding the SE "mb_type" listed in Table 1 are described and illustrated with reference to FIGS. 12A to 12D. FIG. 12A is an exemplary circuit operation of the binarizer 80 illustrated in FIG. 8. Referring to FIG. 12A, the SE mb_type has an I-slice type and a value of, for example, 25. Furthermore, as can be found in Table 1, the type of binarization for mb_type is tree structure. In response to the SE slice type and SE value of mb_type, the tree structure table 81 may generate an output 2'b11, which represents a 2-bit, binary value "11". The multiplexer 805 selects the value 2'b11 as an output based on a selector signal se_type set at 0. Accordingly, the binarizer 80 binarizes the SE into a bin string 2'b11 based on the SE value of 25.

Figure 12B:
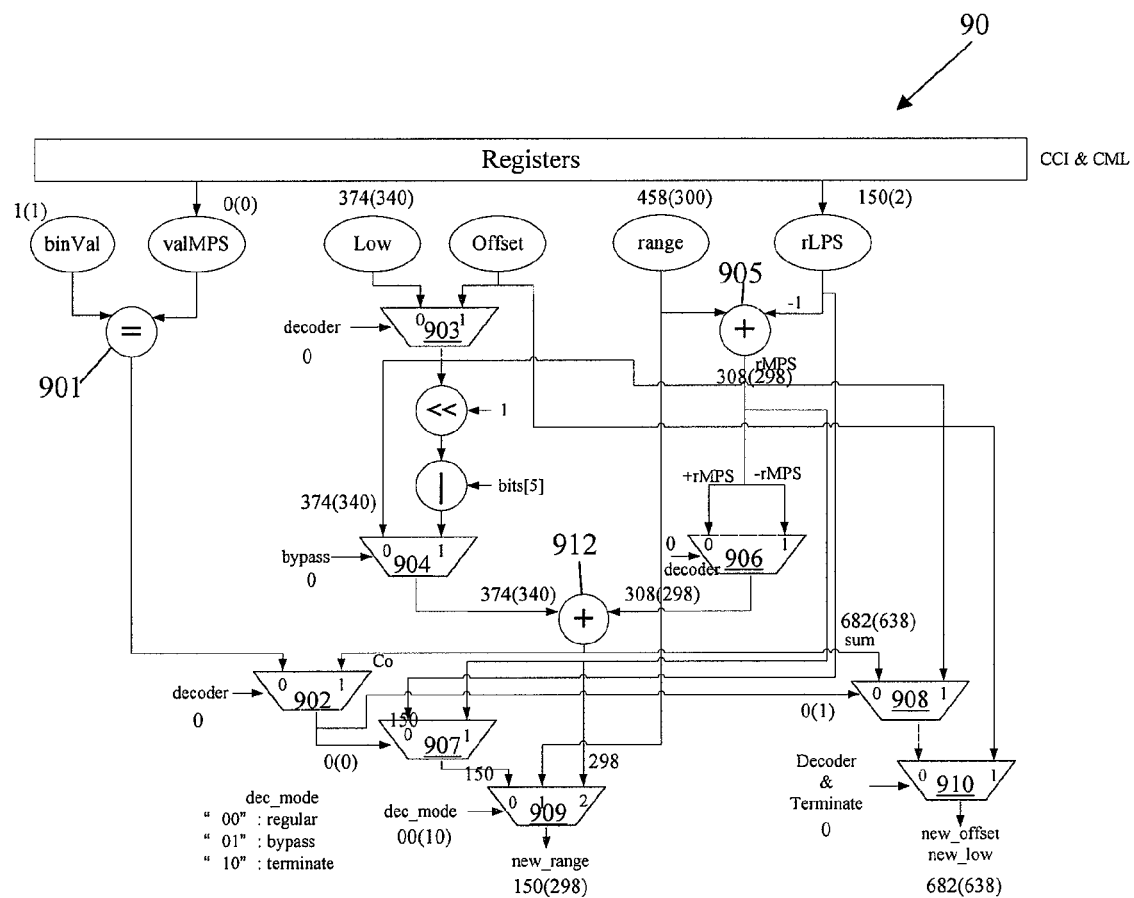
FIG. 12B is an exemplary circuit operation of the BAU illustrated in FIG. 9.

FIG. 12B is an exemplary circuit operation of the BAU 90 illustrated in FIG. 9. Referring to FIG. 12B, an initial value of the variable "binVal", which is the value of the first bin of the bin string 2'b11 (i.e., 11), is 1. The next value of the variable "binVal", which is the value of the second and also the last bin of the bin string 2'b11, is also 1. In the denotation 1(1), the first "1" outside brackets refers to the initial binVal value and the second "1" in brackets refers to the next binVal value. Furthermore, it may be assumed that the variables valMPS, Low, range and rLPS have initial values of 0, 374, 458 and 150, respectively in coding the first binVal. The variable "Offset" is used in the decoding process and not the encoding process and therefore has no value.

By comparing the values of binVal and valMPS, a comparing device 901 may output a value of 0. A first adder 905 outputs a value of 308 by subtracting the value of "rLPS" from the value of "range". The selector signal "decoder" for multiplexers 902, 903 906, 907 and 910 may be set to "0" during the encoding process and the multiplexers 902, 903 906, 907 and 910 may select a value at the "0" input terminal as an output. In other examples, the selector signal "decoder" during a decoding process may be set to "1". In this way, the BAU 90 may serve as a CABAC encoder during an encoding process and serve as a CABAC decoder during a decoding process in accordance with the values of selection pins for multiplexers. Furthermore, the selector signal "bypass" for a multiplexer 904 may be set to "0" when encoding a regular bin. Moreover, the selector signal "dec_mode" for a multiplexer 909 may be set to "00" when encoding a regular bin. A second adder 912 outputs a value of 682 by adding output values of 374 and 308 from the multiplexers 904 and 906, respectively. The selector signals for multiplexers 907 and 908 depend on the output from the multiplexer 902. Subsequently, the value of the variable new_range from the multiplexer 909 is 150 and the value of the variable new_offset new_low from the multiplexer 910 is 682. Since the value of the variable new_range is smaller than 256, a renormalization process may be required.

Figure 12C:
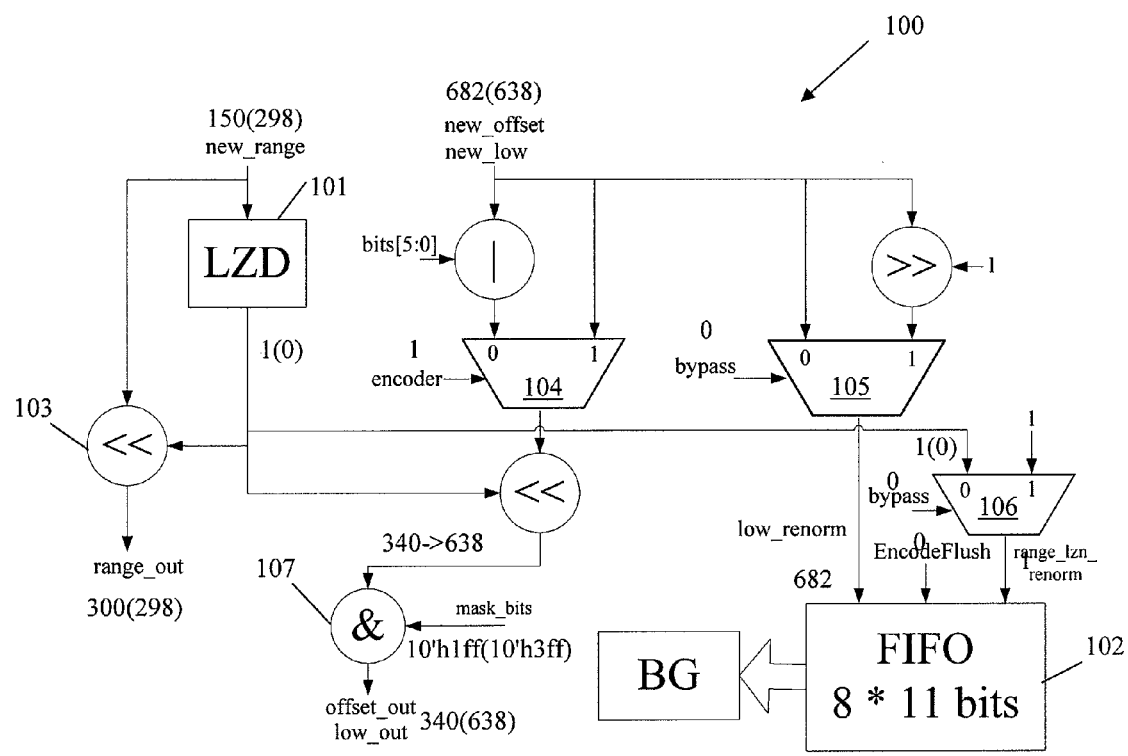
FIG. 12C is an exemplary circuit operation of the renormalization device illustrated in FIG. 10.

FIG. 12C is an exemplary circuit operation of the renormalization device 100 illustrated in FIG. 10. Referring to FIG. 12C, the outputs new_range and new_offset new_low from the BAU 90 may serve as inputs to the renormalization device 100. The LZD 101 may output a value of 1 because the number of leading zero is one given the input value of 150, the binary form of which is 010010110. Based on the LZD output, a first left shifter 103 may shift the binary form 010010110 to the left by one bit, resulting in a new binary form 100101100 or a value of 300, which is greater than 256 and is the double of the input value of 150 of the variable new_range. That is, the variable "range" in FIG. 12B is updated by the new value of 300, which may be used in encoding a next bin. Also based on the LZD output, a second left shifter 108 may shift the binary form 1010101010 of the output value of 682 of a multiplexer 104 to the left by one bit, resulting in a new binary form 0101010100 or a value of 340. AND-gate module 107 may perform a logic AND function for the binary form 0101010100 and mask_bits 10'h1ff, i.e., a 10-bit hexadecimal value 1ff or 0111111111, resulting in a value of 340.

The values of the variables low_renorm and range_lzn_renorm may depend on the output values of multiplexers 105 and 106, respectively. The value of the variable EncodeFlush is set to 0 if a terminate bin currently encoded by a terminate engine has a non-zero value and is set to 1 if the terminate bin has a zero value. The values of the variables low_renorm, range_lzn_renorm and EncodeFlush are fed to the FIFO 102.

Figure 12D:
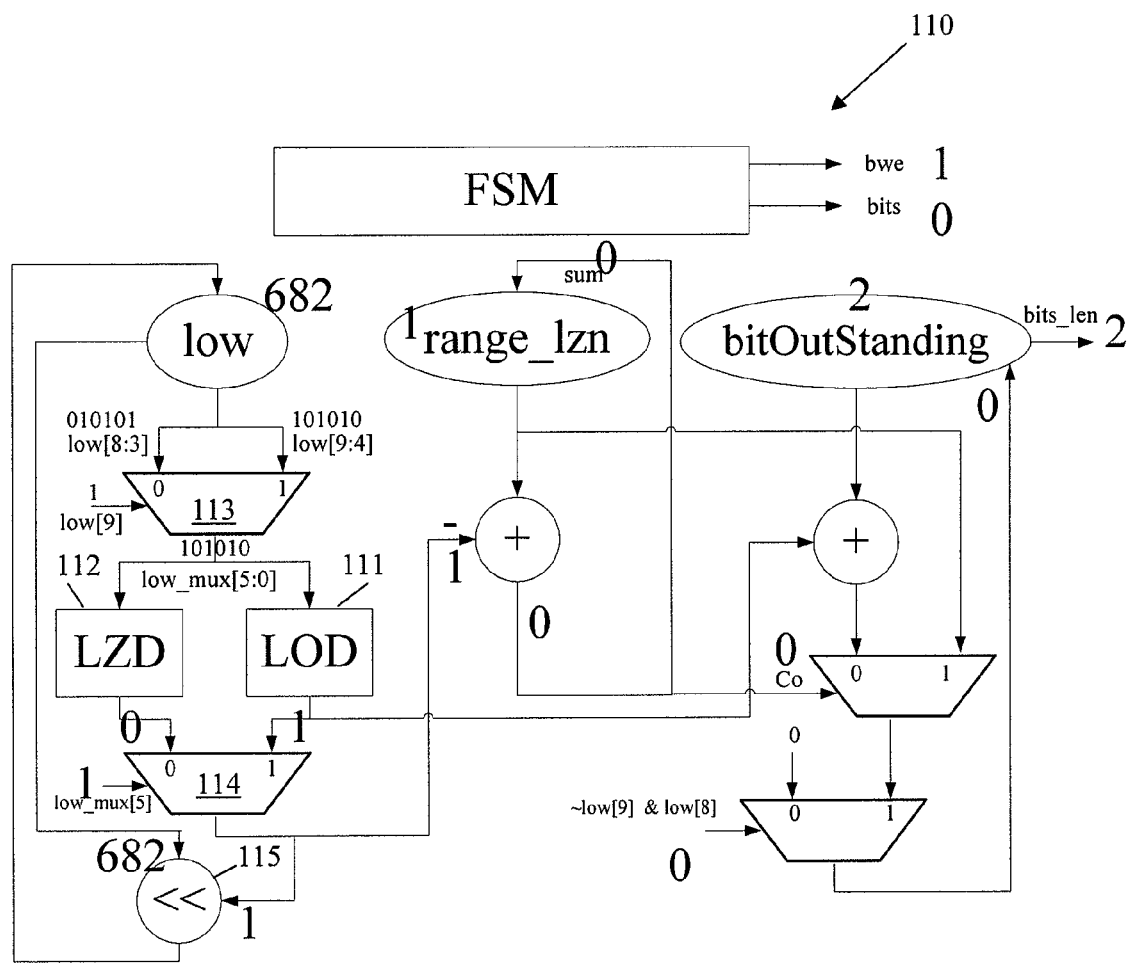
FIG. 12D is an exemplary circuit operation of the bit generator illustrated in FIG. 11.

FIG. 12D is an exemplary circuit operation of the bit generator 110 illustrated in FIG. 11. Referring to FIG. 12D, the variable low_renorm has a value of 682, of which the binary form is 1010101010, and the variable range_lzn has a value of 1, which have been identified at the renormalization device 100. The bit 9 to bit 4, i.e., 101010, is extracted from binary form 1010101010 of the variable low_renorm by a multiplexer 113 and assigned to the variable low_mux. The LOD 111 detects that the number of leading one in the variable low_mux is one, which is selected by the multiplexer 114. Based on the output from the multiplexer 114, a left shifter 115 shifts the binary form 1010101010 to the left by one bit, resulting in a new binary form 0101010100. The variable bitOutStanding, which may be assumed to be 2, is not incremented. Since the signal bwe is logic high, a 2-bit code bit stream having a value of 0 may be generated.

Referring back to FIG. 12B, after the first bin is coded, the second and also the last bin may be coded. The variables Low and range have been respectively updated as 340 and 300 in the renormalization device 100 in encoding the first bin. The values of valMPS and rLPS are assumed to be 0 and 2, respectively. The selector signal "dec_mode" for the multiplexer 909 may be set to "10", the terminate mode, because the last bin is encoded. The value of the variable new_range is 298, which is greater than 256 and therefore is not doubled in the renormalization device 100. Referring again to FIG. 12C, the value of variable range_out equals 298.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

Further, in describing representative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

I claim:

1. A system for context-based adaptive binary arithmetic encoding and decoding, the system comprising:
a calculating device configured to calculate an index value for a first bin to be encoded or a second bin to be decoded;
a memory device configured to store context models in clusters, wherein each cluster is loaded for processing as a single unit and at least one cluster includes multiple context models arranged in an order of syntax element processing, and wherein the index value for the first bin or the second bin is related to one of the context models; and
a binary arithmetic unit configured to serve as an encoder for encoding the first bin based on the one context model or a decoder for decoding the second bin based on the one context model.

2. The system of claim 1 further comprising a binarizer configured to binarize a syntax element into a bin string based on a value of the syntax element.

3. The system of claim 2 further comprising a bit generator configured to generate a bit string for each bin in the bit string.

4. The system of claim 1, wherein the binary arithmetic unit includes a leading zero detector configured to detect the number (N) of leading zeros in the binary form of a first output generated by the binary arithmetic unit, and a left shifter configured to shift the binary form of the first output to the left by N bits when the first output is smaller than a predetermined value.

5. The system of claim 1 further comprising:
a buffer to store a bin value for each bin of a syntax element; and
a de-binarizer configured to detect whether a decoding process for the syntax element is completed and output a value of the syntax element based on the bin value for each bin when the decoding process for the syntax element is completed.

6. The system of claim 1 further comprising a first buffer to store information from a top block and a second buffer to store information from a left block, wherein the calculating device includes a first calculating module configured to calculate a first variable based on the information from the first buffer and the second buffer.

7. The system of claim 6, wherein the calculating device includes a second calculating module configured to calculate the index value based on the value of the first variable.

8. The system of claim 1, wherein the binary arithmetic unit is configured to update the one context model, and store an updated context model in the memory device.

9. The system of claim 8 further comprising:
a first lookup table configured to generate a first value of a second variable in response to the one context model;
a second lookup table configured to generate a second value of the second variable in response to the updated context model; and
a multiplexer to select the first value or the second value.

10. The system of claim 1, wherein the memory device includes a first register bank to store a context model cluster for a syntax element "last_significant_coeff_flag" (LSCF), and a second register bank to store context model clusters for other syntax elements.

11. The system of claim 1, wherein the memory device is configured to store context model clusters in a number of addresses, wherein context model clusters stored at each of the addresses satisfies:

$$\#CMs(SE_i) + \#CMs(SE_{i+1}) + \ldots + \#CMs(SE_{i+n}) \leq P$$

where $SE_i$ represents an i-th syntax element, $\#CMs(SE_i)$ represents the number of context models used in processing the $SE_i$, $SE_i$, $SE_{i+1}$, ..., $SE_{i+n}$ being arranged in an order of processing, and P represents the maximum number of sets of context models of a syntax element among all syntax elements.

12. A system for context-based adaptive binary arithmetic encoding and decoding, the system comprising:
- a calculating device configured to calculate an index value for a first bin to be encoded or a second bin to be decoded;
- a memory device configured to store context models in clusters, wherein the index value for the first bin or the second bin is related to one of the context models; and
- a binary arithmetic unit configured to serve as an encoder for encoding the first bin based on the one context model or a decoder for decoding the second bin based on the one context model, wherein the binary arithmetic unit includes at least one multiplexer controlled by a selector signal having a value related to an encoding status a decoding status of the first bin or the second bin.

13. A method of context-based adaptive binary arithmetic encoding and decoding in a pipeline flow, the method comprising:
- reading context models related to a syntax element having a number of bins (M), obtaining information from at least one neighbor block and calculating a variable based on the information from the at least one neighbor block for the syntax element at a first clock cycle;
- calculating a first index value for a first bin of the syntax element based on the variable and loading one of the context models for the first bin based on the first index value at a second clock cycle;
- processing the first bin in an encoding process or a decoding process based on the one context model related to the first bin and updating said one context model after processing the first bin at a third clock cycle;
- calculating a second index value for a second bin of the syntax element based on the variable and loading one of the context models for the second bin based on the second index value at the third clock cycle; and
- processing the second bin in the encoding process or the decoding process based on the one context model related to the second bin and updating said one context model after processing the second bin at a fourth clock cycle;
- wherein reading context models, calculating the first index value, processing the first bin, calculating the second index value, processing the second bin are performed by circuitry configured to read context models, calculate the first index value, process the first bin, calculate the second index value, and process the second bin.

14. The method of claim 13 further comprising:
- calculating an i-th index value for an i-th bin of the syntax element based on the variable and loading one of the context models for the i-th bin based on the i-th index value at an (i+1)-th clock cycle; and
- processing the i-th bin in the encoding process or the decoding process based on the one context model related to the i-th bin and updating said context model after processing the i-th bin at an (i+2)-th clock cycle, where i≦M.

15. The method of claim 13 further comprising:
- calculating an i-th index value for an i-th bin of the syntax element based on the variable and loading one of the context models for the i-th bin based on the i-th index value at an (i+1)-th clock cycle;
- encoding the i-th bin and updating the one context model related to the i-th bin at an (i+2)-th clock cycle; and
- generating a coded bit string for the i-th bin at an (i+3)-th clock cycle.

16. The method of claim 15 further comprising:
- calculating an (i+1)-th index value for an (i+1)-th bin of the syntax element based on the variable and loading one of the context models for the (i+1)-th bin based on the (i+1)-th index value at the (i+1)-th clock cycle;
- encoding the (i+1)-th bin and updating the one context model related to the (i+1)-th bin at the (i+3)-th clock cycle; and
- generating a coded bit string for the (i+1)-th bin at an (i+4)-th clock cycle.

17. The method of claim 16 further comprising:
- calculating an (i+2)-th index value for an (i+2)-th bin of the syntax element based on the variable and loading one of the context models for the (i+2)-th bin based on the (i+2)-th index value at the (i+2)-th clock cycle;
- encoding the (i+2)-th bin and updating the one context model related to the (i+2)-th bin at the (i+4)-th clock cycle; and
- generating a coded bit string for the (i+2)-th bin at an (i+5)-th clock cycle.

18. The method of claim 13 further comprising:
- calculating an i-th index value for an i-th bin of the syntax element based on the variable and loading one of the context models for the i-th bin based on the i-th index value at an (i+1)-th clock cycle;
- decoding the i-th bin and updating the one context model related to the i-th bin at an (i+2)-th clock cycle; and
- storing a decoded bin value for the i-th bin and detecting whether the decoding process for the syntax element is completed at the (i+2)-th clock cycle.

19. The method of claim 18 further comprising:
- calculating an (i+1)-th index value for an (i+1)-th bin of the syntax element based on the variable and loading one of the context models for the (i+1)-th bin based on the (i+1)-th index value at an (i+2)-th clock cycle;
- decoding the (i+1)-th bin and updating the one context model related to the (i+1)-th bin at an (i+3)-th clock cycle; and
- storing a decoded bin value for the (i+1)-th bin and detecting whether the decoding process for the syntax element is completed at the (i+3)-th clock cycle.

20. The method of claim 19 further comprising:
- calculating an (i+2)-th index value for an (i+2)-th bin of the syntax element based on the variable and loading one of the context models for the (i+2)-th bin based on the (i+2)-th index value at an (i+3)-th clock cycle;
- decoding the (i+2)-th bin and updating the one context model related to the (i+2)-th bin at an (i+4)-th clock cycle; and
- storing a decoded bin value for the (i+2)-th bin and detecting whether the decoding process for the syntax element is completed at the (i+4)-th clock cycle.

21. The method of claim 20 further comprising:
- calculating an M-th index value for an M-th bin of the syntax element based on the variable and loading one of the context models for the M-th bin based on the M-th index value at an (M+1)-th clock cycle;
- decoding the M-th bin and updating the one context model related to the M-th bin at an (M+2)-th clock cycle; and
- storing a decoded bin value for the M-th bin and detecting that the decoding process for the syntax element is completed at the (M+2)-th clock cycle.

22. The method of claim 21 further comprising:
- debinarizing the syntax element and obtaining a value of the syntax element at the (M+2)-th clock cycle; and
- writing back context models related to each of the i-th bin at an (M+3)-th clock cycle, I being from 1 to M.

23. The method of claim 22 further comprising:
writing the value of the syntax element to a first buffer configured to store information from a top block and a second buffer configured to store information from a left block at the (M+3)-th clock cycle.

24. The method of claim 13 further comprising:
binarizing the syntax element into a bin string based on a value of the syntax element at the first clock cycle.

25. The method of claim 13 further comprising:
storing context model in cluster in a number of addresses of a memory device, wherein context model clusters stored at each of the addresses satisfies:

$$\#CMs(SE_i)+\#CMs(SE_{i+1})+\ldots+\#CMs(SE_{i+n}) \leq P$$

where $SE_i$ represents an i-th syntax element, $\#CMs(SE_i)$ represents the number of context models used in processing the $SE_i$, $SE_i$, $SE_{i+1}$, ..., $SE_{i+n}$ being arranged in an order of processing, and P represents the maximum number of sets of context models of a syntax element among all syntax elements.

26. A method of context-based adaptive binary arithmetic encoding and decoding in a pipeline flow, the method comprising:
reading context models related to a first syntax element, obtaining information from at least one neighbor block and calculating a variable based on the information from the at least one neighbor block at a first clock cycle;
calculating a first index value for a first bin of the first syntax element based on the variable and loading one of the context models for the first bin of the first syntax element based on said first index value at a second clock cycle;
reading context models related to a second syntax element at the second clock cycle, wherein the first syntax element and the second syntax element occur in pair in data processing;
decoding the first bin of the first syntax element based on the one context model related to the first bin of the first syntax element and obtaining a value of the first bin of the first syntax element at a third clock cycle;
calculating a first index value for a first bin of the second syntax element based on the variable and loading one of the context models for the first bin of the second syntax element based on said first index value at the third clock cycle in response to one level of the value of the first bin of the first syntax element; and
calculating a second index value for a second bin of the first syntax element based on the variable and loading one of the context models for the second bin of the first syntax element based on said second index value at the third clock cycle in response to the other one level of the value of the first bin of the first syntax element.

27. The method of claim 26, wherein the first syntax element includes "significant_coeff_flag" and the second syntax element includes "last_significant_coeff_flag".

28. The method of claim 26 further comprising:
calculating an i-th index value for an i-th bin of the first syntax element based on the variable and loading one of the context models for the i-th bin of the first syntax element based on said i-th index value at an (i+1) clock cycle;
decoding the i-th bin of the first syntax element based on the one context model related to the i-th bin of the first syntax element and obtaining a value of the i-th bin of the first syntax element at an (i+2) clock cycle;
calculating an i-th index value for an i-th bin of the second syntax element based on the variable and loading one of the context models for the i-th bin of the second syntax element based on said i-th index value at the (i+2) clock cycle in response to one level of the value of the i-th bin of the first syntax element; and
calculating an (i+1) index value for an (i+1) bin of the first syntax element based on the variable and loading one of the context models for the (i+1) bin of the first syntax element based on said (i+1) index value at the (i+2) clock cycle in response to the other one level of the value of the i-th bin of the first syntax element.

29. The method of claim 26 further comprising:
storing context model in cluster in a number of addresses of a memory device, wherein context model clusters stored at each of the addresses satisfies:

$$\#CMs(SE_i)+\#CMs(SE_{i+1})+\ldots+\#CMs(SE_{i+n}) \leq P$$

where $SE_i$ represents an i-th syntax element, $\#CMs(SE_i)$ represents the number of context models used in processing the $SE_i$, $SE_i$, $SE_{i+1}$, ..., $SE_{1+n}$ being arranged in an order of processing, and P represents the maximum number of sets of context models of a syntax element among all syntax elements.

30. The method of claim 26 further comprising:
assigning a first register bank to store a context model cluster for the second syntax element "last_significant_coeff_flag" (LSCF); and
assigning a second register bank to store context model clusters for other syntax elements including the first syntax element.

* * * * *

UNITED STATES PATENT AND TRADEMARK OFFICE
CERTIFICATE OF CORRECTION

| | | |
|---|---|---|
| PATENT NO. | : 7,777,654 B2 | Page 1 of 1 |
| APPLICATION NO. | : 12/189457 | |
| DATED | : August 17, 2010 | |
| INVENTOR(S) | : Chang | |

It is certified that error appears in the above-identified patent and that said Letters Patent is hereby corrected as shown below:

<u>Column 17,</u>

Line 17, "status a" should read --status or a--.

Signed and Sealed this

Seventeenth Day of May, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,777,654 B2 | Page 1 of 1 |
| APPLICATION NO. | : 12/189457 | |
| DATED | : August 17, 2010 | |
| INVENTOR(S) | : Chang | |

It is certified that error appears in the above-identified patent and that said Letters Patent is hereby corrected as shown below:

Title page, Item [54] and Column 1, line 3,

In the title, "ARITHEMATIC" should read --ARITHMETIC--.

Signed and Sealed this
Twenty-sixth Day of July, 2011

David J. Kappos
*Director of the United States Patent and Trademark Office*